(12) United States Patent
Min et al.

(10) Patent No.: US 10,818,657 B2
(45) Date of Patent: Oct. 27, 2020

(54) SEMICONDUCTOR DEVICE AND METHOD FOR CONTROLLING GATE PROFILE USING THIN FILM STRESS IN GATE LAST PROCESS

(71) Applicant: Samsung Electronics Co., Ltd., Suwon-si (KR)

(72) Inventors: Sun-Ki Min, Seoul (KR); Koung-Min Ryu, Hwaseong-si (KR); Sang-Koo Kang, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 411 days.

(21) Appl. No.: 15/233,123

(22) Filed: Aug. 10, 2016

(65) Prior Publication Data
US 2017/0053913 A1 Feb. 23, 2017

(30) Foreign Application Priority Data
Aug. 18, 2015 (KR) .......................... 10-2015-0116256

(51) Int. Cl.
*H01L 27/088* (2006.01)
*H01L 29/78* (2006.01)
(Continued)

(52) U.S. Cl.
CPC .... *H01L 27/0886* (2013.01); *H01L 29/42376* (2013.01); *H01L 29/7843* (2013.01);
(Continued)

(58) Field of Classification Search
CPC ..... H01L 21/823437; H01L 21/823456; H01L 21/823828; H01L 21/82385;
(Continued)

(56) References Cited

U.S. PATENT DOCUMENTS 7,105,394 B2 9/2006 Hachimine et al.
7,476,580 B2 1/2009 Zhu et al.
(Continued)

FOREIGN PATENT DOCUMENTS

CN 104681616 A 6/2015

OTHER PUBLICATIONS

First Office Action, dated Jul. 3, 2020, for corresponding Chinese Patent Application CN 201610669304.6 (12 pages).

*Primary Examiner* — Eric A. Ward
*Assistant Examiner* — Eric K Ashbahian
(74) *Attorney, Agent, or Firm* — Muir Patent Law, PLLC

(57) ABSTRACT

There is provided a semiconductor device capable of adjusting profiles of a gate electrode and a gate spacer using a hybrid interlayer insulating film. The semiconductor device includes a gate electrode on a substrate, a gate spacer being on a sidewall of the gate electrode and including an upper portion and a lower portion, a lower interlayer insulating film being on the substrate and overlapping with the lower portion of the gate spacer, and an upper interlayer insulating film being on the lower interlayer insulating film and overlapping with the upper portion of the gate spacer, wherein the lower interlayer insulating film is not interposed between the upper interlayer insulating film and the upper portion of the gate spacer.

9 Claims, 19 Drawing Sheets

(51) Int. Cl.
  *H01L 29/423* (2006.01)
  *H01L 21/8234* (2006.01)
(52) U.S. Cl.
  CPC .. *H01L 29/7851* (2013.01); *H01L 21/823412* (2013.01); *H01L 21/823468* (2013.01); *H01L 21/823481* (2013.01); *H01L 27/088* (2013.01)
(58) Field of Classification Search
  CPC ....... H01L 29/7856; H01L 2029/42384; H01L 29/7843; H01L 29/513; H01L 29/518; H01L 29/42376; H01L 29/7851; H01L 27/0886; H01L 21/31155; H01L 29/7842; H01L 29/7847; H01L 29/42364
  See application file for complete search history.

(56) References Cited

U.S. PATENT DOCUMENTS

| | | | |
|---|---|---|---|
| 7,719,090 B2 | 5/2010 | Satoh | |
| 8,198,147 B2 | 6/2012 | Feustel et al. | |
| 8,216,928 B1* | 7/2012 | Richter | H01L 21/823412 |
| | | | 257/E21.42 |
| 8,420,470 B2 | 4/2013 | Choi | |
| 8,492,847 B2 | 7/2013 | Murata et al. | |
| 8,791,502 B2 | 7/2014 | Wang | |
| 9,006,836 B2 | 4/2015 | Yang et al. | |
| 2006/0246672 A1* | 11/2006 | Chen | H01L 29/78 |
| | | | 438/301 |
| 2009/0057771 A1* | 3/2009 | Fukasaku | H01L 21/28097 |
| | | | 257/369 |
| 2009/0087974 A1* | 4/2009 | Waite | H01L 21/28088 |
| | | | 438/592 |
| 2010/0264471 A1 | 10/2010 | Zhu | |
| 2012/0034757 A1* | 2/2012 | Choi | H01L 21/02222 |
| | | | 438/437 |
| 2012/0199912 A1* | 8/2012 | Flachowsky | H01L 28/20 |
| | | | 257/365 |
| 2015/0145066 A1* | 5/2015 | Lu | H01L 29/66795 |
| | | | 257/401 |
| 2016/0099324 A1* | 4/2016 | Chang | H01L 21/28114 |
| | | | 257/401 |

* cited by examiner

SEMICONDUCTOR DEVICE AND METHOD FOR CONTROLLING GATE PROFILE USING THIN FILM STRESS IN GATE LAST PROCESS

CROSS-REFERENCE TO RELATED APPLICATION

This application claims the benefit of priority under 35 U.S. § 119 from Korean Patent Application No. 10-2015-0116256, filed on Aug. 18, 2015, in the Korean Intellectual Property Office, the contents of which in its entirety are herein incorporated by reference.

BACKGROUND

1. Technical Field

The present disclosure relates to a semiconductor device, and more particularly, to a semiconductor device comprising a fin-type pattern.

2. Description of the Related Art

To enhance semiconductor device density, one of the scaling technologies is the multigate transistor in which a multi-channel active pattern (or silicon body) in a fin or nanowire shape is formed on a substrate, with gates then being formed on a surface of the multi-channel active pattern.

The multigate transistor allows easy scaling as it uses a three-dimensional channel. Further, current control capability can be enhanced without requiring increased gate length of the multigate transistor. Furthermore, it is possible to effectively suppress short channel effect (SCE) which is the phenomenon in which the electric potential of the channel region is influenced by the drain voltage.

SUMMARY

An object of the present disclosure is to provide a semiconductor device capable of adjusting profiles of a gate electrode and a gate spacer using a hybrid interlayer insulating film.

The objectives that are intended to be addressed by the present disclosure are not limited to that mentioned above, and other objectives that are not mentioned above can be clearly understood to those skilled in the art based on the description provided below.

According to an aspect, there is provided a semiconductor device comprising a gate electrode on a substrate; a gate spacer formed on a sidewall of the gate electrode and including an upper portion and a lower portion; a lower interlayer insulating film formed on the substrate and adjacent to the lower portion of the gate spacer and having a first stress characteristic; and an upper interlayer insulating film formed on the lower interlayer insulating film and adjacent to the upper portion of the gate spacer and having a second stress characteristic, wherein the lower interlayer insulating film is not interposed between the upper interlayer insulating film and the upper portion of the gate spacer.

In some embodiments, a width of the gate electrode increases as a distance from an upper surface of the substrate increases.

In some embodiments, a width of the gate electrode decreases as a distance from an upper surface of the substrate increases.

In some embodiments, the gate electrode includes a first sidewall and a second sidewall opposed to each other, wherein the first sidewall of the gate electrode has a slope at a right angle with a bottom surface of the gate electrode, and wherein the second sidewall of the gate electrode has a slope at an acute angle with the bottom surface of the gate electrode.

In some embodiments, the gate electrode includes a first sidewall and a second sidewall opposed to each other, wherein the first sidewall of the gate electrode has a slope at a right angle with a bottom surface of the gate electrode, and wherein the second sidewall of the gate electrode has a slope at an obtuse angle with respect to the bottom surface of the gate electrode.

In some embodiments, an upper surface of the upper portion of the gate spacer includes an inclined surface at an acute angle with respect to an upper surface of the upper interlayer insulating film.

In some embodiments, the semiconductor device may further comprise a source/drain region formed on both sides of the gate electrode, and an etch-stop layer formed along a sidewall of the gate spacer and an upper surface of the source/drain region. The etch-stop layer extends between the lower interlayer insulating film and the lower portion of the gate spacer.

In some embodiments, the upper interlayer insulating film covers an uppermost portion of the etch-stop layer.

In some embodiments, a boundary between the lower interlayer insulating film and the upper interlayer insulating film has a convex shape relative to an upper surface of the substrate.

In some embodiments, a boundary surface between the lower interlayer insulating film and the upper interlayer insulating film is a flat surface.

In some embodiments, a stress characteristic of the upper interlayer insulating film is different from the stress characteristic of the lower interlayer insulating film.

In some embodiments, the semiconductor device may further comprise a fin-type pattern protruding from the substrate. The gate electrode is formed on the fin-type pattern to intersect the fin-type pattern.

According to another aspect, there is provided a semiconductor device comprising a substrate including a first region and a second region; a first gate electrode in the first region and on the substrate; a second gate electrode in the second region and on the substrate; a first gate spacer on a sidewall of the first gate electrode and including an upper portion and a lower portion; a second gate spacer on a sidewall of the second gate electrode and including an upper portion and a lower portion; a lower interlayer insulating film on the substrate and adjacent to the lower portion of the first gate spacer and the lower portion of the second gate spacer; and an upper interlayer insulating film on the lower interlayer insulating film and adjacent to the upper portion of the first gate spacer and the upper portion of the second gate spacer, an upper surface of the upper interlayer insulating film being on a same plane as an upper surface of the first gate electrode and an upper surface of the second gate electrode, wherein a slope of the sidewall of the first gate electrode relative to a bottom surface of the first gate electrode is different from a slope of the sidewall of the second gate electrode relative to a bottom surface of the second gate electrode.

In some embodiments, wherein a width of the first gate electrode remains substantially constant as a distance from an upper surface of the substrate increases, and a width of the second gate electrode increases as the distance from the upper surface of the substrate increases.

In some embodiments, wherein a width of the first gate electrode remains substantially constant as a distance from an upper surface of the substrate increases, and a width of the second gate electrode decreases as the distance from the upper surface of the substrate increases.

In some embodiments, the semiconductor device may further comprise a third gate electrode formed on the substrate in the first region and being adjacent to the first gate electrode, and a fourth gate electrode formed on the substrate in the second region and being adjacent to the second gate electrode. Relative to a bottom surface of the first gate electrode and a bottom surface of the third gate electrode, a spacing between the first gate electrode and the third gate electrode is different from a spacing between the second gate electrode and the fourth gate electrode with reference to the bottom surface of the second gate electrode and the bottom surface of the fourth gate electrode.

In some embodiments, a gate electrode is not disposed between the first gate electrode and the third gate electrode, nor between the second gate electrode and the fourth gate electrode.

In some embodiments, a thickness of the lower interlayer insulating film in the first region is different from a thickness of the lower interlayer insulating film in the second region.

In some embodiments, the lower interlayer insulating film is not interposed between the upper interlayer insulating film and the upper portion of the first gate spacer, nor between the upper interlayer insulating film and the upper portion of the second gate spacer.

In some embodiments, the semiconductor device may further comprise a first fin-type pattern and a second fin-type pattern protruding from the substrate. The first gate electrode intersects with the first fin-type pattern, and the second gate electrode intersects with the second fin-type pattern.

According to still another aspect, there is provided a semiconductor device comprising a substrate including a first region and a second region; a first gate electrode formed in the first region and on the substrate; a second gate electrode formed in the second region and on the substrate; a first gate spacer formed on a sidewall of the first gate electrode and including an upper portion and a lower portion; a second gate spacer formed on a sidewall of the second gate electrode and including an upper portion and a lower portion; a lower interlayer insulating film formed on the substrate and adjacent to the lower portion of the first gate spacer and the lower portion of the second gate spacer; and an upper interlayer insulating film formed on the lower interlayer insulating film and adjacent to the upper portion of the first gate spacer and the upper portion of the second gate spacer, wherein the lower interlayer insulating film is not interposed between the upper interlayer insulating film and the upper portion of the first gate spacer, and not interposed between the upper interlayer insulating film and the upper portion of the second gate spacer, and wherein a ratio of a thickness of the upper interlayer insulating film to a thickness of the lower interlayer insulating film in the first region, is smaller than a ratio of a thickness of the upper interlayer insulating film to a thickness of the lower interlayer insulating film in the second region.

In some embodiments, a stress characteristic of the upper interlayer insulating film is different from the stress characteristic of the lower interlayer insulating film.

In some embodiments, a slope of the sidewall of the first gate electrode relative to a bottom surface of the first gate electrode is different from a slope of the sidewall of the second gate electrode relative to a bottom surface of the second gate electrode.

In some embodiments, a width of the first gate electrode remains substantially constant as a distance from an upper surface of the substrate increases, and a width of the second gate electrode decreases as the distance from the upper surface of the substrate increases.

In some embodiments, the lower interlayer insulating film has a tensile stress characteristic, and the upper interlayer insulating film has a compressive stress characteristic.

In some embodiments, a width of the first gate electrode remains substantially constant as a distance from an upper surface of the substrate increases, and a width of the second gate electrode increases as the distance from the upper surface of the substrate increases.

In some embodiments, the lower interlayer insulating film has a compressive stress characteristic, and the upper interlayer insulating film has a tensile stress characteristic.

According to still another aspect, there is provided a semiconductor device comprising a fin-type pattern; a first and a second gate electrodes disposed on the fin-type pattern, and intersecting with the fin-type pattern and being adjacent to each other; a first gate spacer disposed on a sidewall of the first gate electrode and including an upper portion and a lower portion; a second gate spacer disposed on a sidewall of the second gate electrode and including an upper portion and a lower portion; a lower interlayer insulating film disposed between the first gate electrode and the second gate electrode, and overlapping with the lower portion of the first gate spacer and with the lower portion of the second gate spacer; and an upper interlayer insulating film disposed on the lower interlayer insulating film and overlapping with the upper portion of the first gate spacer and with the upper portion of the second gate spacer, wherein the first gate electrode including a first sidewall and a second sidewall opposed to each other, wherein a slope of the first sidewall of the first gate electrode relative to a bottom surface of the first gate electrode, and wherein a slope of the sidewall of the second gate electrode relative to a bottom surface of the second gate electrode are at a right angle, respectively, and the slope of the second sidewall of the first gate electrode relative to the bottom surface of the first gate electrode is at an acute angle or an obtuse angle.

In some embodiments, the first sidewall of the first gate electrode is more adjacent to the second gate electrode than the second sidewall of the first gate electrode.

In some embodiments, the semiconductor device may further comprise a third gate electrode being adjacent to the first gate electrode. The first gate electrode is disposed between the second gate electrode and the third gate electrode, and a distance between the first gate electrode and the second gate electrode is different from a distance between the first gate electrode and the third gate electrode.

In some embodiments, the lower interlayer insulating film is not interposed between the upper interlayer insulating film and the upper portion of the first gate spacer, nor between the upper interlayer insulating film and the upper portion of the second gate spacer.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
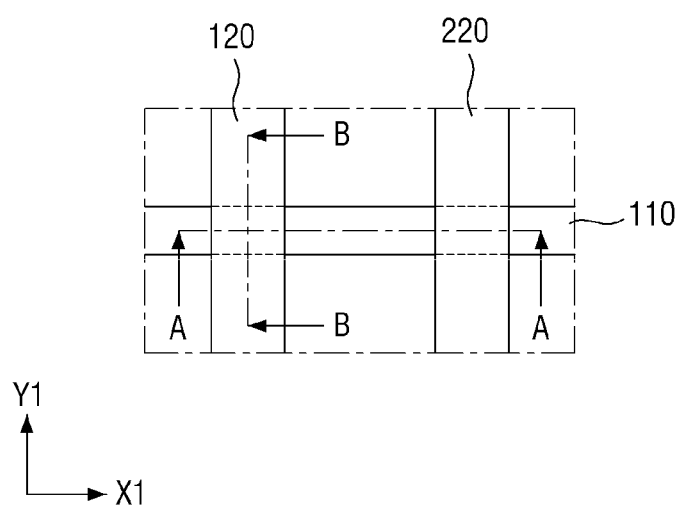
FIG. 1 is a top view provided to explain a semiconductor device, according to some exemplary embodiments.

Advantages and features and methods of accomplishing the same may be understood more readily by reference to the following detailed description of certain embodiments and the accompanying drawings. The present disclosure concept may, however, be embodied in many different forms and should not be construed as being limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the relative sizes and thicknesses of layers and regions are exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

It will be understood that when an element or layer is referred to as being "on," "connected to," "electrically connected to," or "coupled to" another element or layer, it can be directly on, connected to, electrically connected to, or coupled to another element or layer or intervening elements or layers may be present. In contrast, when an element is referred to as being "directly on," "directly connected to," "directly electrically connected to," or "directly coupled to" another element or layer, or as contacting or in contact with another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, etc. may be used herein to describe various elements, these elements should not be limited by these terms. Unless the text indicates otherwise, these terms are only used to distinguish one element from another element. For example, a first element, a first component or a first section discussed below could be termed a second element, a second component or a second section without departing from the teachings of the present disclosure.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to limit the scope of the example embodiments.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

Unless defined otherwise, all technical and scientific terms used herein have the same meaning as commonly understood by one of ordinary skill in the art. It is noted that the use of any and all examples, or exemplary terms provided herein is intended merely to better illuminate the disclosed embodiments and is not a limitation on the scope unless otherwise specified. Further, unless defined otherwise, all terms defined in generally used dictionaries may not be overly interpreted.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory. A chip or package that includes the semiconductor devices may also be referred to generally as a semiconductor device.

Reference will now be made to example embodiments, which are illustrated in the accompanying drawings, wherein like reference numerals may refer to like components throughout.

Hereinbelow, a semiconductor device according to certain exemplary embodiments will be explained with reference to FIGS. 1 to 4B.

Figure 2:
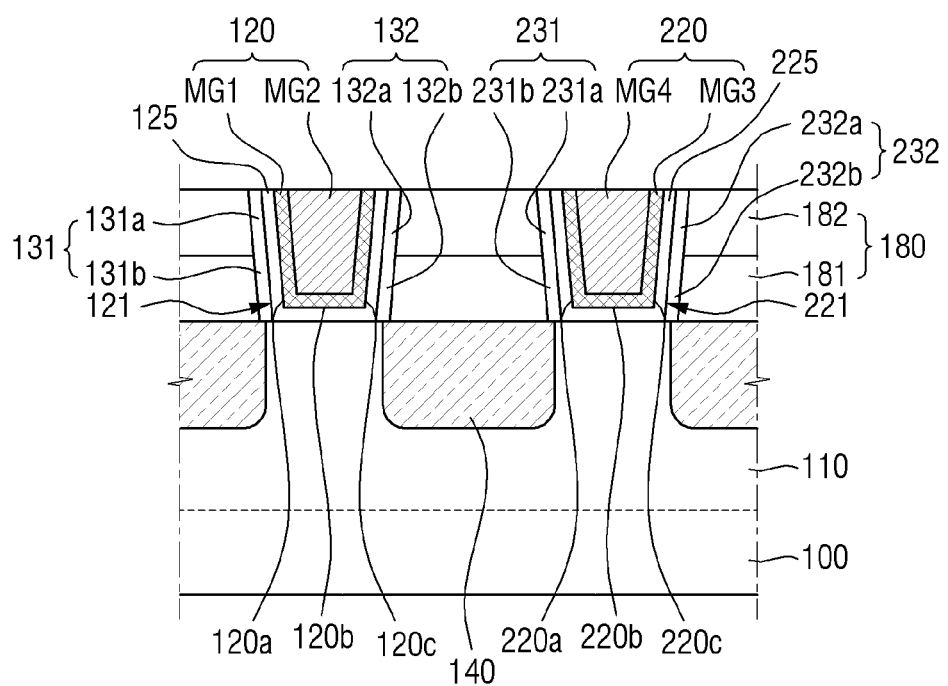
FIG. 2 is a cross sectional view taken on line A-A of FIG. 1, according to certain disclosed embodiments.
Figure 3A:
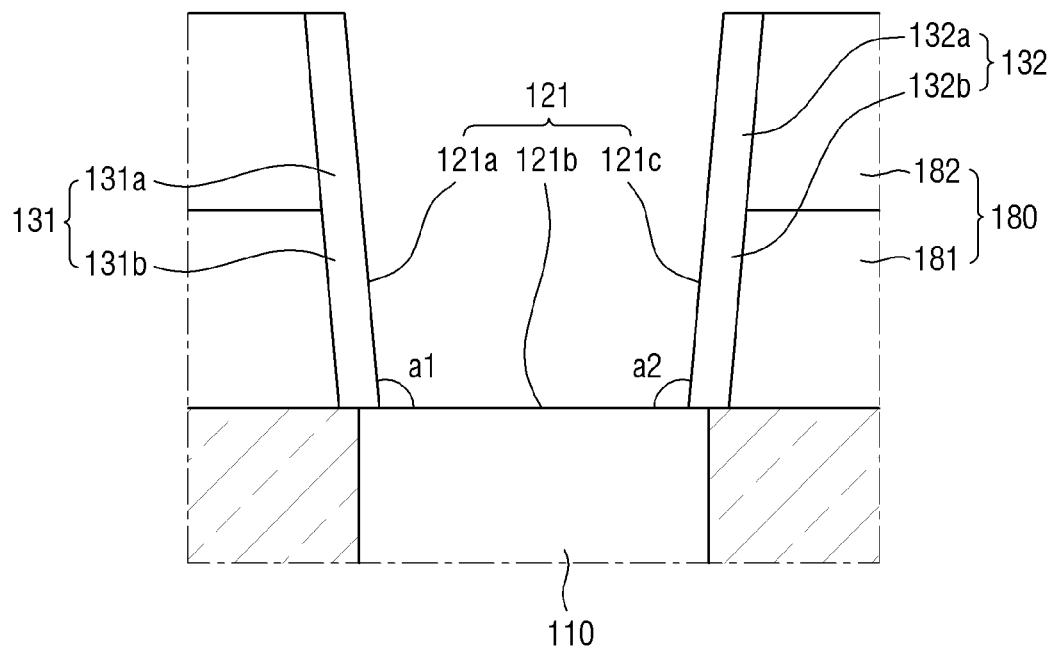
FIG. 3A is a view illustrating a first gate spacer from which the first gate electrode of FIG. 2 is omitted, according to certain disclosed embodiments.
Figure 3B:
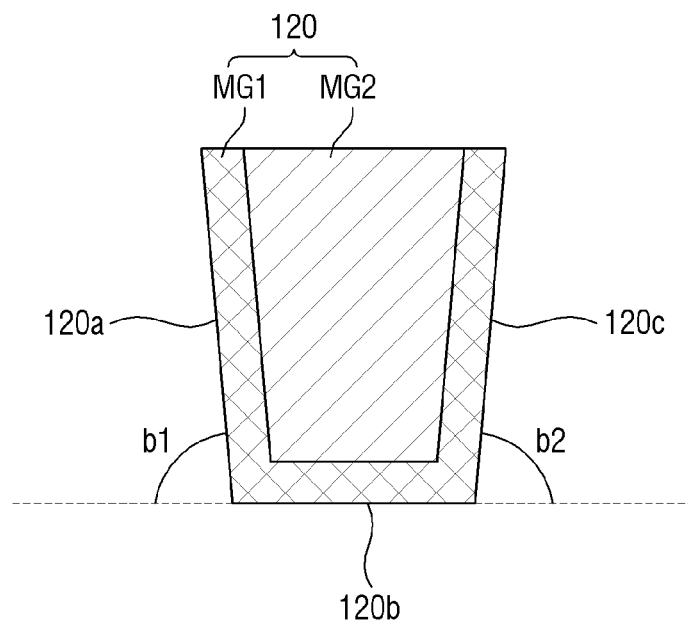
FIG. 3B illustrates the first gate electrode of FIG. 2 separately, according to certain disclosed embodiments.
Figure 4A:
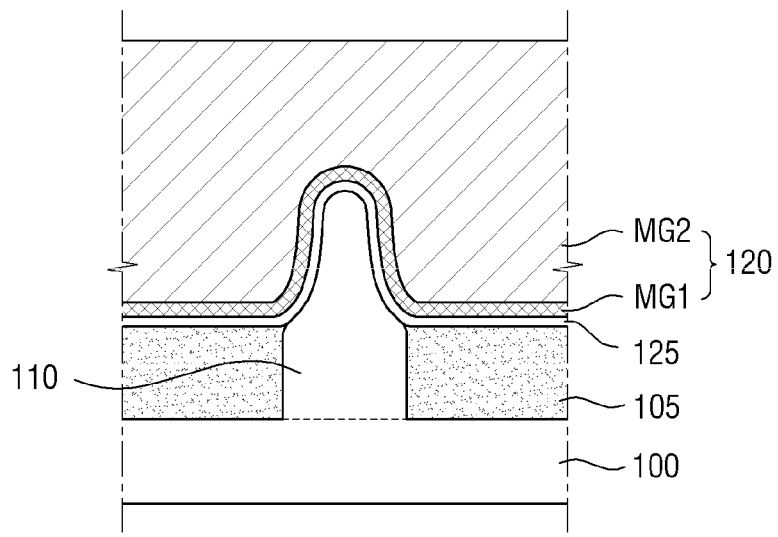
FIGS. 4A and 4B are cross sectional views taken on line B-B of FIG. 1, according to certain disclosed embodiments.
Figure 4B:
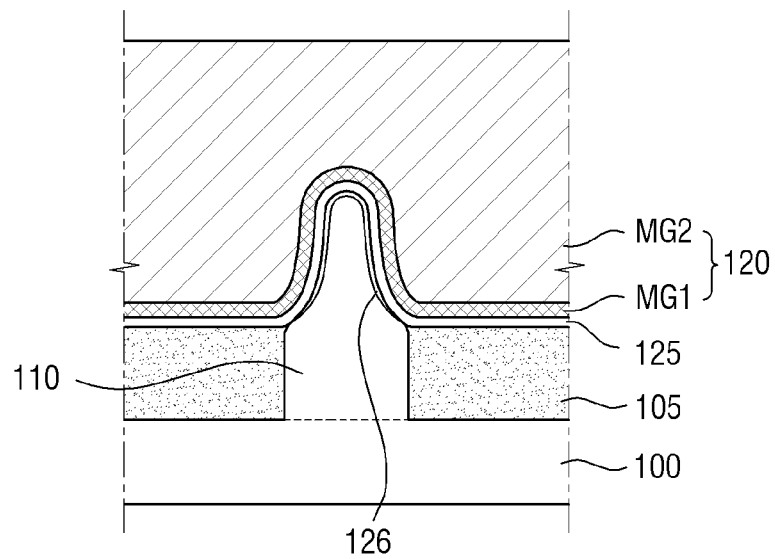

FIG. 1 is a top view provided to explain a semiconductor device according to some exemplary embodiments. FIG. 2 is a cross sectional view taken along line A-A of FIG. 1. FIG. 3A is a view illustrating a first gate spacer from which the first gate electrode of FIG. 2 is omitted, and FIG. 3B illustrates the first gate electrode of FIG. 2 separately. FIGS. 4A and 4B are cross sectional views taken along line B-B of FIG. 1.

As exemplified in the drawings, a semiconductor device may include a channel region having a fin-type pattern shape, but exemplary embodiments are not limited thereto. Accordingly, the semiconductor device may include a channel region having a wire-pattern shape instead of the fin-type pattern shape.

Further, although it is exemplified below that a semiconductor device includes a fin-type field effect transistor (FINFET) utilizing a fin-type pattern, exemplary embodiments are not limited thereto. Accordingly, a semiconductor device according to exemplary embodiments may include a planar transistor.

Referring to FIGS. 1 to 4B, the semiconductor device according to some exemplary embodiments may include a first fin-type pattern 110, a first gate electrode 120, a second gate electrode 220, first gate spacers 131, 132, second gate spacers 231, 232, a lower interlayer insulating film 181, and an upper interlayer insulating film 182.

The semiconductor device may include a substrate 100. The substrate 100 may be a bulk silicon or a silicon-on-insulator (SOI), for example. Alternatively, the substrate 100 may be a silicon substrate, or may include other substance such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The first fin-type pattern 110 may protrude from the substrate 100. The first fin-type pattern 110 may extend longitudinally in a first direction X1 that is perpendicular to a second direction Y1.

As used herein, the term "first fin-type pattern 110" may refer to an active pattern used in a multigate transistor. In such exemplary embodiments, the first fin-type pattern 110 may be formed as the channels are connected with each other along three surfaces of the fin, or alternatively, may be formed as the channels formed on two opposing surfaces of the fin.

The first fin-type pattern 110 may be a part of the substrate 100, or may include an epitaxial layer grown on the substrate 100. For example, the first fin-type pattern 110 may protrude from the substrate because it is an epitaxial layer extending above part of the substrate. Alternatively, the first fin-type pattern 110 may protrude from the substrate because it is part of the substrate that protrudes from a lower part of the substrate.

The first fin-type pattern 110 may include an element semiconductor material such as silicon or germanium, for example. Further, the first fin-type pattern 110 may include a compound semiconductor such as, for example, IV-IV group compound semiconductor or III-V group compound semiconductor.

For example, in embodiments including the Iv-Iv group compound semiconductor, the first fin-type pattern 110 may be a binary compound or a ternary compound including, for example, at least two or more of carbon (C), silicon (Si), germanium (Ge), and tin (Sn), or the above-mentioned binary or ternary compound doped with IV group element.

In embodiments including the III-V group compound semiconductor, for example, the first fin-type pattern 110 may be a binary compound, a ternary compound, or a quaternary compound formed by a combination of a III group element, which may be at least one of aluminum (Al), gallium (Ga), and indium (In), with a V group element which may be one of phosphorus (P), arsenic (As) and antimony (Sb).

In the semiconductor device according to exemplary embodiments, the first fin-type pattern 110 may be a silicon fin-type pattern which includes silicon.

A first field insulating film 105 may be formed on the substrate 100. The first field insulating film 105 may partially cover a side surface of the first fin-type pattern 110. Accordingly, an upper surface of the first fin-type pattern 110 may protrude upward higher than an upper surface of the first field insulating film 105 disposed on the long side of the first fin-type pattern 110. For example, referring to FIGS. 1, 4A, and 4B, the first field insulating film 105 may be disposed along both, opposite side surfaces of the first fin-type pattern 110 in the first direction X1, and an upper surface of the first fin-type pattern 110 may protrude above the first field insulating film 105. The first fin-type pattern 110 may be defined by the first field insulating film 105 on the substrate 100.

The first field insulating film 105 may include, for example, oxide film, nitride film, oxynitride film, or a combination thereof.

The first gate electrode 120 may extend in the second direction Y1. The first gate electrode 120 may be formed to intersect the first fin-type pattern 110. For example, the first gate electrode 120 may be formed to pass over or cross the first fin-type pattern 110.

The first gate electrode 120 may be formed on the first fin-type pattern 110 and the first field insulating film 105. The first gate electrode 120 may surround the first fin-type pattern 110 protruding upward higher than the upper surface of the first field insulating film 105. In some embodiments, the first gate electrode 120 may surround at least portions of the first fin-type pattern 110 and may cover portions of the first field insulating film 105, and an upper surface of the first gate electrode 120 may protrude above the first fin-type pattern 110 and the first field insulating film 105.

The first gate electrode 120 may include a first sidewall 120a and a second sidewall 120c opposed to each other. The first gate electrode 120 may include a bottom surface 120b which connects the first sidewall 120a of the first gate electrode with the second sidewall 120c of the first gate electrode, and extends along the upper surface of the first fin-type pattern 110. For example, the first sidewall 120a and the second sidewall 120c may extend in an upwards direction, perpendicular to the first and second directions X1 and Y1, and the bottom surface 120b may extend in a direction parallel to the first or second directions X1 and Y1.

The second gate electrode 220 may extend in the second direction Y1. The second gate electrode 220 may be formed on the first fin-type pattern 110 so as to intersect the first fin-type pattern 110. For example, the second gate electrode 220 may be formed to pass over or cross the first fin-type pattern 110.

The second gate electrode 220 may be formed adjacent to the first gate electrode 120. No other gate electrode intersecting the first fin-type pattern 110 may be formed between the second gate electrode 220 and the first gate electrode 120.

The second gate electrode 220 may include a first sidewall 220a and a second sidewall 220c opposed to each other. The second gate electrode 220 may include a bottom surface 220b which connects the first sidewall 220a of the second gate electrode with the second sidewall 220c of the second gate electrode, and extends along the upper surface of the first fin-type pattern 110. For example, the first sidewall 220a and the second sidewall 220c may extend in an upwards direction, perpendicular to the first and second directions X1 and Y1, and the bottom surface 220b may extend in a direction parallel to the first or second directions X1 and Y1.

The first gate electrode 120 may include metal layers MG1, MG2. For example, the first gate electrode 120 may include a stack of two or more metal layers MG1, MG2, as illustrated. The first metal layer MG1 plays a role of adjusting a work function, and the second metal layer MG2 plays a role of filling a space defined by the first metal layer MG1. For example, the first metal layer MG1 may include at least one of, for example, TiN, WN, TiAl, TiAlN, TaN, TiC, TaC, TaCN, TaSiN and a combination thereof, but not limited thereto. Further, the second metal layer MG2 may include at least one of, for example, W, Al, Cu, Co, Ti, Ta, poly-Si, SiGe and a metal alloy, but not limited thereto.

The second gate electrode 220 may include metal layers MG3, MG4. For example, the second gate electrode 220 may include a stack of two or more metal layers MG3, MG4, as illustrated. The third metal layer MG3 plays a role of adjusting a work function, and the fourth metal layer MG4 plays a role of filling a space defined by the first metal layer MG3. Description of the second gate electrode 220 may be similar to that of the first gate electrode 120.

The first gate electrode 120 and the second gate electrode 220 may be formed by replacement process (or gate last process), but not limited thereto.

The first gate spacers 131, 132 may be disposed on sidewalls of the first gate electrode 120. The first gate spacers 131, 132 may include a first one-side spacer 131 disposed on the first sidewall 120a of the first gate electrode, and a first other-side spacer 132 disposed on the second sidewall 120c of the first gate electrode.

The first one-side spacer 131 and the first other-side spacer 132 may define a first trench 121. The first sidewall 121a of the first trench may be defined by the first one-side spacer 131, and the second sidewall 121c of the first trench may be defined by the first other-side spacer 132. The bottom surface 121b of the first trench may be defined by connecting the first sidewall 121a of the first trench with the second sidewall 121c of the first trench. For example, the bottom surface 121b of the first trench may be a top surface of the first fin-type pattern 110.

The first gate spacers 131, 132 may include lower portions 131b, 132b, and upper portions 131a, 132a. For example, the first one-side spacer 131 may include the lower portion 131b and the upper portion 131a, and the first other-side spacer 132 may include the lower portion 132b and the upper portion 132a.

The second gate spacers 231, 232 may be disposed on sidewalls of the second gate electrode 220. The second gate spacers 231, 232 may include a second one-side spacer 231 disposed on the first sidewall 220a of the second gate electrode, and a second other-side spacer 232 disposed on the second sidewall 220c of the second gate electrode.

The second one-side spacer 231 and the second other-side spacer 232 may define a second trench 221. The first sidewall 221a of the second trench may be defined by the second one-side spacer 231, and the second sidewall 221c of the second trench may be defined by the second other-side spacer 232. The bottom surface 221b of the second trench may be defined by connecting the first sidewall 221a of the second trench with the second sidewall 221c of the second trench. For example, the bottom surface 221b of the second trench may be a top surface of the first fin-type pattern 110.

The second gate spacers 231, 232 may include lower portions 231b, 232b, and upper portions 231a, 232a. For example, the second one-side spacer 231 may include the lower portion 231b and the upper portion 231a, and the second other-side spacer 232 may include the lower portion 232b and the upper portion 232a.

The first gate electrode 120 may be formed by filling the first trench 121 defined by the first gate spacers 131, 132. The second gate electrode 220 may be formed by filling the second trench 221 defined by the second gate spacers 231, 232.

The first gate spacers 131, 132 and the second gate spacers 231, 232 may each include at least one of, for example, silicon nitride (SiN), silicon oxynitride (SiON), silicon oxide (SiO$_2$), silicon oxycarbonitride (SiOCN), and a combination thereof.

A first gate insulating film 125 may be formed between the first fin-type pattern 110 and the first gate electrode 120. The first gate insulating film 125 may be formed along the profile of the first fin-type pattern 110 protruding upward higher than the first field insulating film 105. In some embodiments, the first gate insulating film 125 may formed on top surfaces of the first field insulating film 105 and the first fin-type pattern 110, and an upper surface of the first gate insulating film 125 may protrude above the first fin-type pattern 110 and the first field insulating film 105.

The first gate insulating film 125 may be disposed between the first gate electrode 120 and the first field insulating film 105. The first gate insulating film 125 may be formed along the sidewalls and the bottom surface of the first trench 121. The first gate insulating film 125 may be formed between the first gate spacers 131, 132 and the first gate electrode 120.

Further, an interfacial layer 126 may be additionally formed between the first gate insulating film 125 and the first fin-type pattern 110. Although not illustrated in FIG. 4A, in some embodiments, an interfacial layer may also be additionally formed between the first gate insulating film 125 and the first fin-type pattern 110.

As illustrated in FIG. 4B, in some embodiments, the interfacial layer 126 may be formed along the profile of the first fin-type pattern 110 which protrudes higher than the upper surface of the first field insulating film 105, although exemplary embodiments are not limited thereto. For example, the interfacial layer 126 may be formed between the first fin-type pattern 110 and the first gate insulating film 125 over regions in which the first field insulating film 105 is not formed.

The interfacial layer 126 may extend along the upper surface of the first field insulating film 105 according to a method of forming the interfacial layer 126. For example, the interfacial layer 126 may extend from one edge of the upper surface of the first field insulating film 105 to another edge of the upper surface of the first field insulating film 105.

Hereinbelow, exemplary embodiments are explained by referring to drawings in which illustration of the interfacial layer 126 is omitted for convenience of explanation.

A second gate insulating film 225 may be formed between the first fin-type pattern 110 and the second gate electrode 220. The second gate insulating film 225 may be disposed between the second gate electrode 220 and the first field insulating film 105. The second gate insulating film 225 may be formed along the sidewalls and the bottom surface of the second trench 221. The second gate insulating film 225 may be formed along the profile of the first fin-type pattern 110 protruding upward higher than the first field insulating film 105. In some embodiments, the second gate insulating film 225 may formed on top surfaces of the first field insulating film 105 and the first fin-type pattern 110, and an upper surface of the second gate insulating film 225 may protrude above the first fin-type pattern 110 and the first field insulating film 105.

The second gate insulating film 225 may be formed between the second gate spacers 231, 232 and the second gate electrode 220. Description of the second gate insulating film 225 may be similar to that of the first gate insulating film 125.

The first gate insulating film 125 and the second gate insulating film 225 may include a high-k dielectric material having a higher dielectric constant than a silicon oxide film. For example, the first gate insulating film 125 and the second gate insulating film 225 may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

First source/drain regions 140 may be formed on both sides of the first gate electrode 120 and on both sides of the second gate electrode 220. For example, first source/drain regions 140 may be formed between the first gate electrode 120 and an adjacent second gate electrode 220.

As illustrated, the first source/drain regions 140 may be impurity regions formed within the first fin-type pattern 110, but exemplary embodiments are not limited thereto. Accordingly, the first source/drain regions 140 may include an epitaxial layer formed on the first fin-type pattern 110 or formed within the first fin-type pattern 110.

Further, the first source/drain regions 140 may be elevated source/drain regions including an upper surface which is protruded upward higher than the upper surface of the first fin-type pattern 110. For example, in some embodiments, top surfaces of the first source/drain regions 140 may be higher than an upper surface of the first fin-type pattern 110.

The interlayer insulating film 180 may be formed on the substrate 100. The interlayer insulating film 180 may cover the first fin-type pattern 110, the first source/drain regions 140, and the first field insulating film 105. For example, the interlayer insulating film 180 may be formed above the substrate 100 and on one or more of the first fin-type pattern 110, the first source/drain regions 140, and the first field insulating film 105.

The interlayer insulating film 180 may surround the sidewalls of the first gate electrode 120 and the second gate electrode 220. In some embodiments, the interlayer insulating film 180 may surround the outer sidewalls of the first gate spacers 131, 132 and the outer sidewalls of the second gate spacers 231, 232.

The interlayer insulating film 180 may include a lower interlayer insulating film 181 and an upper interlayer insulating film 182 stacked on the substrate 100 in a sequential order.

The lower interlayer insulating film 181 may be formed on the first fin-type pattern 110. The lower interlayer insulating film 181 may overlap with the lower portions 131b, 132b of the first gate spacers 131, 132, and the lower portions 231b, 232b of the second gate spacers 231, 232. For example, the lower interlayer insulating film 181 may be adjacent to the lower portions 131b, 132b of the first gate spacers 131, 132, and adjacent to the lower portions 231b, 232b of the second gate spacers 231, 232.

The lower interlayer insulating film 181 may surround sidewalls of the lower portion 131b of the first one-side spacer 131, the lower portion 132b of the first other-side spacer 132, the lower portion 231b of the second one-side spacer 231, and the lower portion 232b of the second other-side spacer 232.

For example, the portions of the first gate spacers 131, 132 and the second gate spacers 231, 232 with the sidewalls thereof surrounded by the lower interlayer insulating film 181 may be defined into the lower portion 131b of the first one-side spacer 131, the lower portion 132b of the first other-side spacer 132, the lower portion 231b of the second one-side spacer 231, and the lower portion 232b of the second other-side spacer 232.

In some embodiments, the lower interlayer insulating film 181 may include silicon oxide, silicon nitride, silicon oxynitride, flowable oxide (FOX), Tonen silazen (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The upper interlayer insulating film 182 may be formed on the lower interlayer insulating film 181. The upper interlayer insulating film 182 may overlap with the upper portions 131a, 132a of the first gate spacers 131, 132, and the upper portions 231a, 232a of the second gate spacers 231, 232. For example, the upper interlayer insulating film 182 may be adjacent to the upper portions 131a, 132a of the first gate spacers 131, 132, and adjacent to the upper portions 231a, 232a of the second gate spacers 231, 232.

The upper interlayer insulating film 182 may surround sidewalls of the upper portion 131a of the first one-side spacer 131, the upper portion 132a of the first other-side spacer 132, the upper portion 231a of the second one-side spacer 231, and the upper portion 232a of the second other-side spacer 232.

For example, the portion with the sidewalls thereof surrounded by the upper interlayer insulating film 182 may be defined into the upper portion 131a of the first one-side spacer 131, the upper portion 132a of the first other-side spacer 132, the upper portion 231a of the second one-side spacer 231, and the upper portion 232a of the second other-side spacer 232.

As illustrated in FIG. 2, the upper surface of the first gate electrode 120 and the upper surface of the second gate electrode 220 may be on the same plane as the upper surface of the upper interlayer insulating film 182, but exemplary embodiments are not limited thereto.

For example, in order to construct a self-aligned contact (SAC) structure, capping patterns may be formed on the upper surfaces of the first gate electrode 120 and the second gate electrode 220, respectively, in which case the upper surface of the first gate electrode 120 and the upper surface of the second gate electrode 220 may be lower than the upper surface of the upper interlayer insulating film 182.

In some embodiments, the upper interlayer insulating film 182 may include silicon oxide, silicon nitride, silicon oxynitride, flowable oxide (FOX), Tonen silazen (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The lower interlayer insulating film 181 is not interposed between the upper interlayer insulating film 182 and the upper portions 131a, 132a of the first gate spacers 131, 132, nor between the upper interlayer insulating film 182 and the upper portions 231a, 232a of the second gate spacers 231, 232.

The boundary surface between the lower interlayer insulating film 181 and the upper interlayer insulating film 182 may be a flat surface. In some embodiments, the lower surface of the lower interlayer insulating film 181 and the upper surface of the upper interlayer insulating film 182 may be planar surfaces.

The height from the substrate 100 to the upper surface of the interlayer insulating film 180 may be substantially the same as the height from the substrate 100 to the uppermost portions of the first gate spacers 131, 132. Further, the height from the substrate 100 to the upper surface of the interlayer insulating film 180 may be substantially the same as the height from the substrate 100 to the uppermost portions of the second gate spacers 231, 232. In some embodiments, a thickness of the interlayer insulating film 180 may be the same as a thickness or height of the first gate spacers 131, 132, and the thickness of the interlayer insulating film 180 may be the same as a thickness or height of the second gate spacers 231, 232.

In a semiconductor device according to an exemplary embodiment, the stress characteristic of the lower interlayer insulating film 181 may be different from the stress characteristic of the upper interlayer insulating film 182.

More specifically, when the lower interlayer insulating film 181 has a tensile stress characteristic, the upper interlayer insulating film 182 may have a compressive stress characteristic. Conversely, when the lower interlayer insulating film 181 has a compressive stress characteristic, the upper interlayer insulating film 182 may have a tensile stress characteristic.

As used herein, the term "tensile stress characteristic" may refer to the interlayer insulating film having a tension that pulls the gate electrode or the gate spacers toward the interlayer insulating film, and the term "compressive stress characteristic" may refer to the interlayer insulating film having a tension that pushes the gate electrode or the gate spacers away from the interlayer insulating film.

For example, when the interlayer insulating film has a tensile stress characteristic, the gate spacers are subject to a force that acts in a direction from the gate electrode to the interlayer insulating film. Conversely, when the interlayer insulating film has a compressive stress characteristic, the gate spacers are subject to a force that acts in a direction from the interlayer insulating film to the gate electrode.

The interlayer insulating film 180, which includes the lower interlayer insulating film 181 and the upper interlayer insulating film 182 having different stress characteristics from each other, may have overall stress characteristic that varies according to differences between the lower interlayer insulating film 181 and the upper interlayer insulating film 182, such as, for example, different thicknesses, different volumes, etc.

Additionally, the lower interlayer insulating film 181 and the upper interlayer insulating film 182 may include different materials from each other, or may include the same material.

When the lower interlayer insulating film 181 and the upper interlayer insulating film 182 include a same material, the conditions for forming the lower interlayer insulating film 181, including heat treatment condition, and the conditions for forming the upper interlayer insulating film 182, including heat treatment condition, may be different from each other. Accordingly, the lower interlayer insulating film 181 and the upper interlayer insulating film 182 can have different stress characteristics from each other.

Referring to FIGS. 2 and 3A, the first sidewall 121a of the first trench 121, as defined by the first one-side spacer 131, may have a slope at a first angle a1 with respect to the bottom surface 121b of the first trench 121. The second sidewall 121c of the first trench 121, as defined by the first other-side spacer 132, may have a slope at a second angle a2 with respect to the bottom surface 121b of the first trench 121.

The first angle a1 and the second angle a2 may be obtuse angles exceeding a right angle. The width of the first trench 121 may increase as a distance from the upper surface of the substrate 100 increases. For example, the width of the first trench 121 may increase in a direction moving from the bottom surface 121b of the first trench 121 to an upper portion of the first trench 121. In some embodiments, the width of the first trench 121 may be the distance between the first sidewall 121a and the second sidewall 121c.

As illustrated in FIG. 3A, when the first sidewall 121a of the first trench and the second sidewall 121c of the first trench respectively have slopes at an obtuse angle with respect to the bottom surface 121b of the first trench, the degree of tensile stress of the lower interlayer insulating film 181 may be greater than the degree of compressive stress of the upper interlayer insulating film 182.

For example, if the lower interlayer insulating film 181 has the tensile stress characteristic as its stress characteristic and the upper interlayer insulating film 182 has the compressive stress characteristic as its stress characteristic, then the first sidewall 121a of the first trench and the second sidewall 121c of the first trench may have slopes at obtuse angles with respect to the bottom surface 121b of the first trench 121. Conversely, if the lower interlayer insulating film 181 has the compressive stress characteristic as its stress characteristic and the upper interlayer insulating film 182 has the tensile stress characteristic as its stress characteristic, then the first sidewall 121a of the first trench and the second sidewall 121c of the first trench may have slopes at acute angles, rather than obtuse angles, with respect to the bottom surface 121b of the first trench 121. Referring to FIGS. 2 and 3B, the first sidewall 120a of the first gate electrode 120 may have a slope at a third angle b1 with respect to a surface facing the bottom surface 120b of the first gate electrode 120. The second sidewall 120c of the first gate electrode 120 may have a slope at a fourth angle b2 with respect to a surface facing the bottom surface 120b of the first gate electrode 120.

When the first sidewall 120a of the first gate electrode 120 is opposite the first sidewall 121a of the first one-side spacer 131 and the second sidewall 120c of the first gate electrode 120 is opposite the second sidewall 121c of the first other-side spacer 132, the third angle b1 and the fourth angle b2 may be acute angles that are smaller than the right angle. In some embodiments, when the first sidewall 120a of the first gate electrode 120 is adjacent to the first sidewall 121a of the first one-side spacer 131, the third angle b1 may complement the first angle a1 (i.e., first angle a1+third angle b1=180 degrees), and when the second sidewall 120c of the first gate electrode 120 is adjacent to the second sidewall 121c of the first other-side spacer 132, the fourth angle b2 may complement the second angle a2 (i.e., second angle a2+fourth angle b2=180 degrees).

The width of the first gate electrode 120 may increase as a distance from the upper surface of the substrate 100 increases. For example, the width of the first gate electrode 120 may increase in a direction from the bottom surface 120b of the first gate electrode to the upper surface of the first gate electrode 120. In some embodiments, the width of the first gate electrode 120 may be the distance between the first sidewall 120a and the second sidewall 120c.

In FIG. 3B, each of the first sidewall 120a, the second sidewall 120c, and the bottom surface 120b are illustrated as planes, and each of the first sidewall 120a and the second sidewall 120c are illustrated as intersecting with the bottom surface 120b along lines. In other embodiments, the region where the first sidewall 120a of the first gate electrode 120 and the bottom surface 120b of the first gate electrode 120 meet, and the region where the second sidewall 120c of the first gate electrode 120 and the bottom surface 120b of the first gate electrode 120 meet may have rounded shapes, but it is apparent to those skilled in the art that the slope of the first sidewall 120a of the first gate electrode 120 and the slope of the second sidewall 120c of the first gate electrode 120 may still retain a slope relative to the bottom surface 120b of the first gate electrode 120.

The second gate electrode 220 and the second trench 221 will not be redundantly described as these may be substantially similar to the first gate electrode 120 and the first trench 121 described above.

Hereinbelow, it may be understood that the sidewall of the trench has a positive slope when the sidewall of the trench has a slope at an obtuse angle with the bottom surface of the trench. Likewise, it may be understood that the sidewall of the gate electrode has a positive slope when the sidewall of the gate electrode has a slope at an obtuse angle with the bottom surface of the gate electrode.

For example, referring to FIG. 2, the first sidewall 120a of the first gate electrode 120, the second sidewall 120c of the first gate electrode 120, the first sidewall 220a of the second gate electrode 220, and the second sidewall 220c of the second gate electrode 220 each may have positive slopes.

Figure 5:
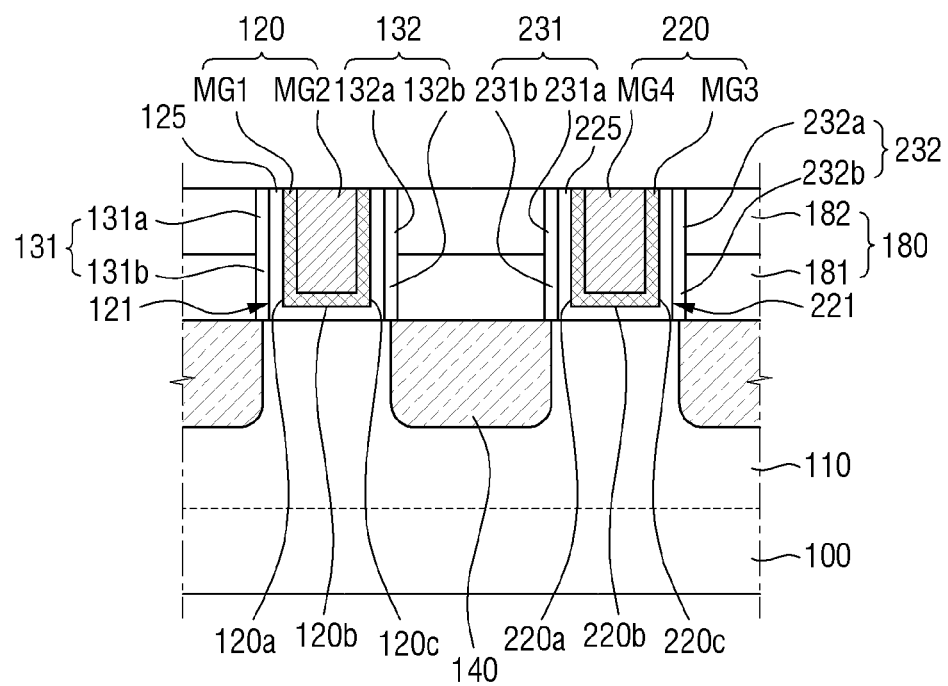
FIG. 5 is a view provided to explain a semiconductor device, according to some exemplary embodiments.
Figure 6:
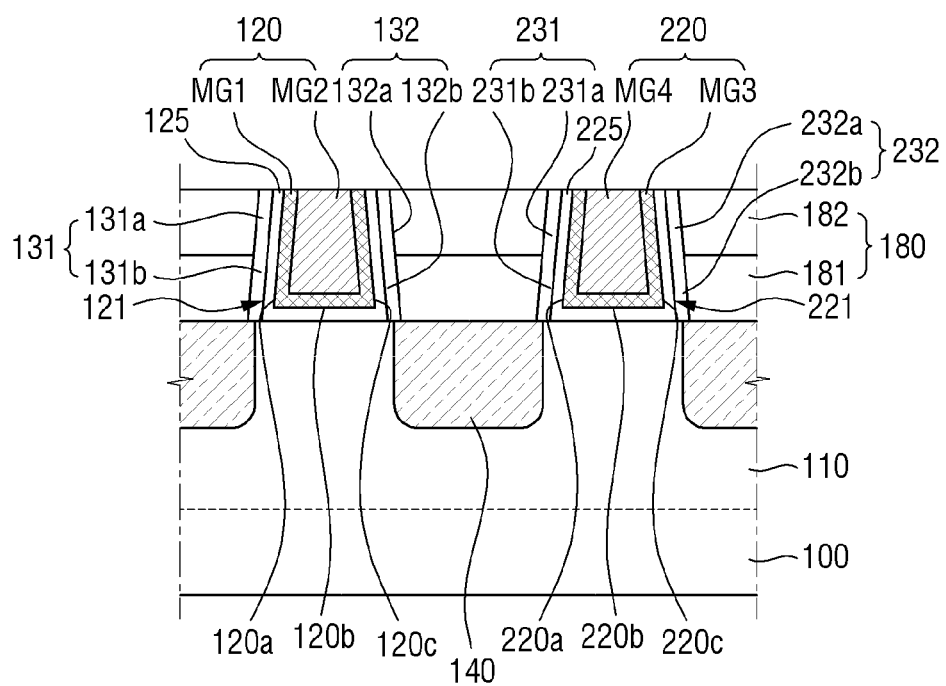
FIG. 6 is a view provided to explain a semiconductor device, according to some exemplary embodiments.

FIG. 5 is a view provided to explain a semiconductor device according to some exemplary embodiments. FIG. 6 is a view provided to explain a semiconductor device according to some exemplary embodiments. For convenience of explanation, differences that are not explained above with reference to FIGS. 1 to 4B will be mainly explained below.

For reference, FIGS. 5 and 6 are cross sectional views taken on line A-A of FIG. 1.

Referring to FIG. 5, in a semiconductor device according to some exemplary embodiments, the first sidewall 120a of the first gate electrode 120 and the second sidewall 120c of the first gate electrode 120 may have slopes at a right angle with the bottom surface 120b of the first gate electrode 120.

Likewise, the first sidewall 220a of the second gate electrode 220 and the second sidewall 220c of the second gate electrode 220 may have slopes at right angles with the bottom surface 220b of the second gate electrode 220.

The width of the first gate electrode 120 may remain substantially constant as a distance from the upper surface of the substrate 100 increases. For example, the width of the first gate electrode 120 may remain the same in a direction moving from the bottom surface 120b of the first gate electrode 120 to an upper portion of the first gate electrode 120. In some embodiments, the width of the first gate electrode 120 may be the distance between the first sidewall 120a and the second sidewall 120c.

The first sidewall 121a of the first trench 121, as defined by the first one-side spacer 131, may have a slope at a right angle with respect to the bottom surface 121b of the first trench 121, and the second sidewall 121c of the first trench 121, as defined by the first other-side spacer 132, may have a slope at a right angle with respect to the bottom surface of the first trench 121.

Description of the second trench 221 may be similar to that of the first trench 121.

Referring to FIG. 6, in a semiconductor device according to some exemplary embodiments, the first sidewall 120a of the first gate electrode 120 and the second sidewall 120c of the first gate electrode 120 may have slopes at an acute angle with the bottom surface 120b of the first gate electrode 120.

Likewise, the first sidewall 220a of the second gate electrode 220 and the second sidewall 220c of the second gate electrode 220 may have slopes at an acute angle with the bottom surface 220b of the second gate electrode 220.

The width of the first gate electrode 120 and the width of the second gate electrode 220 may decrease as a distance from the upper surface of the substrate 100 increases.

For example, the width of the first gate electrode 120 may decrease in a direction from the bottom surface 120b of the first gate electrode to the upper surface of the first gate electrode 120. The width of the second gate electrode 220 may decrease in a direction from the bottom surface 220b of the second gate electrode to the upper surface of the second gate electrode 220. In some embodiments, the width of the first gate electrode 120 may be the distance between the first sidewall 120a and the second sidewall 120c of the first gate electrode 120, and the width of the second gate electrode 220 may be the distance between the first sidewall 220a and the second sidewall 220c of the second gate electrode 220.

The first sidewall 121a of the first trench 121, as defined by the first one-side spacer 131, may have a slope at an acute angle with respect to the bottom surface 121b of the first trench 121, and the second sidewall 121c of the first trench 121, as defined by the first other-side spacer 132, may have a slope at an acute angle with respect to the bottom surface 121b of the first trench 121.

Description of the second trench 221 may be similar to that of the first trench 121.

Referring to FIG. 6, the first sidewall 120a of the first gate electrode 120, the second sidewall 120c of the first gate electrode 120, the first sidewall 220a of the second gate electrode 220, and the second sidewall 220c of the second gate electrode 220 each may have negative slopes. For example, each of the slopes of the first sidewall 120a of the first gate electrode 120, the slope of the second sidewall 120c of the first gate electrode 120, the slope of the first sidewall 220a of the second gate electrode 220, and the slope of the second sidewall 220c of the second gate electrode 220 may be acute angles with respect to bottom surfaces of the respective first and second gate electrodes 120 and 220.

Figure 7A:
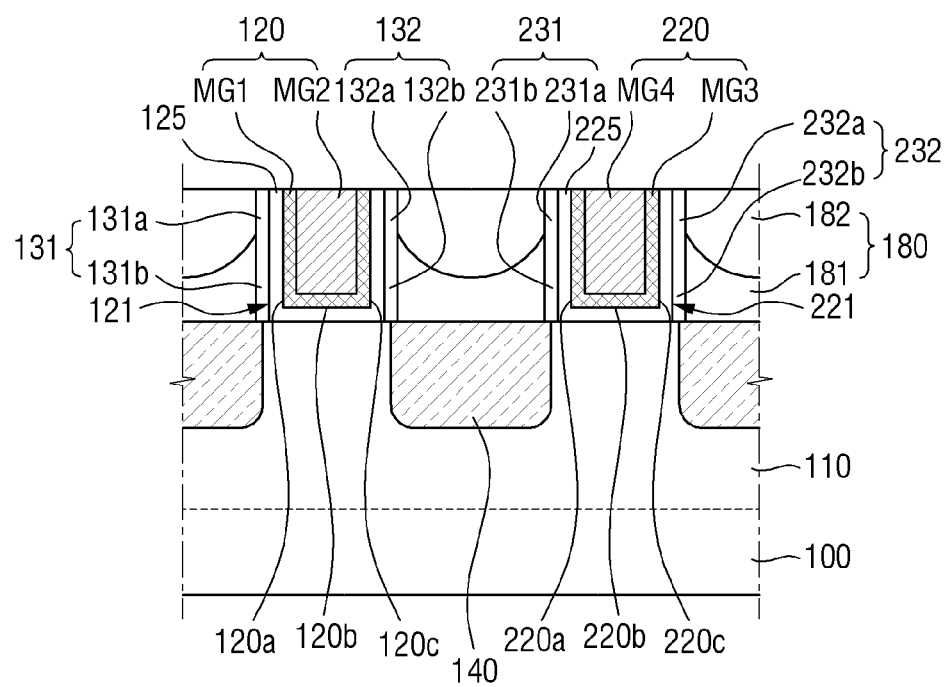
FIGS. 7A and 7B are views provided to explain a semiconductor device, according to some exemplary embodiments.
Figure 7B:
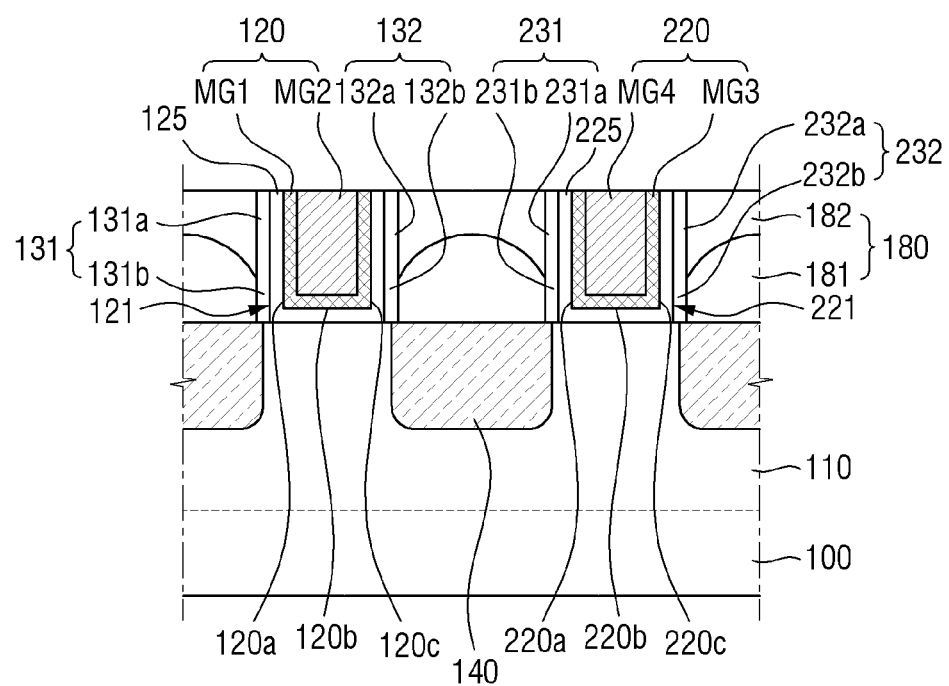

FIGS. 7A and 7B are views provided to explain a semiconductor device according to some exemplary embodiments. For convenience of explanation, differences that are not explained above with reference to FIG. 5 will be mainly explained below.

For reference, FIGS. 7A and 7B are cross sectional views taken on line A-A of FIG. 1.

Referring to FIGS. 7A and 7B, in a semiconductor device according to some exemplary embodiments, the boundary between the lower interlayer insulating film 181 and the upper interlayer insulating film 182 may have a curved surface.

Referring to FIG. 7A, the boundary between the lower interlayer insulating film 181 and the upper interlayer insulating film 182 may have a convex shape relative to the upper surface of the substrate 100, i.e., to the upper surface of the first fin-type pattern 110. For example, the boundary between the lower interlayer insulating film 181 and the upper interlayer insulating film 182 may have a shape that is rounded or curved in a direction away from the upper surface of the substrate 100.

Referring to FIG. 7B, the boundary between the lower interlayer insulating film 181 and the upper interlayer insulating film 182 may have a concave shape relative to the upper surface of the substrate 100. For example, the boundary between the lower interlayer insulating film 181 and the upper interlayer insulating film 182 may have a shape that is rounded or curved in a direction toward the upper surface of the substrate 100.

The shape of the boundary between the lower interlayer insulating film 181 and the upper interlayer insulating film 182 may vary depending on, for example, a method of etching the lower interlayer insulating film 181 in the manufacturing process, an etchant used for etching, etc.

Figure 8:
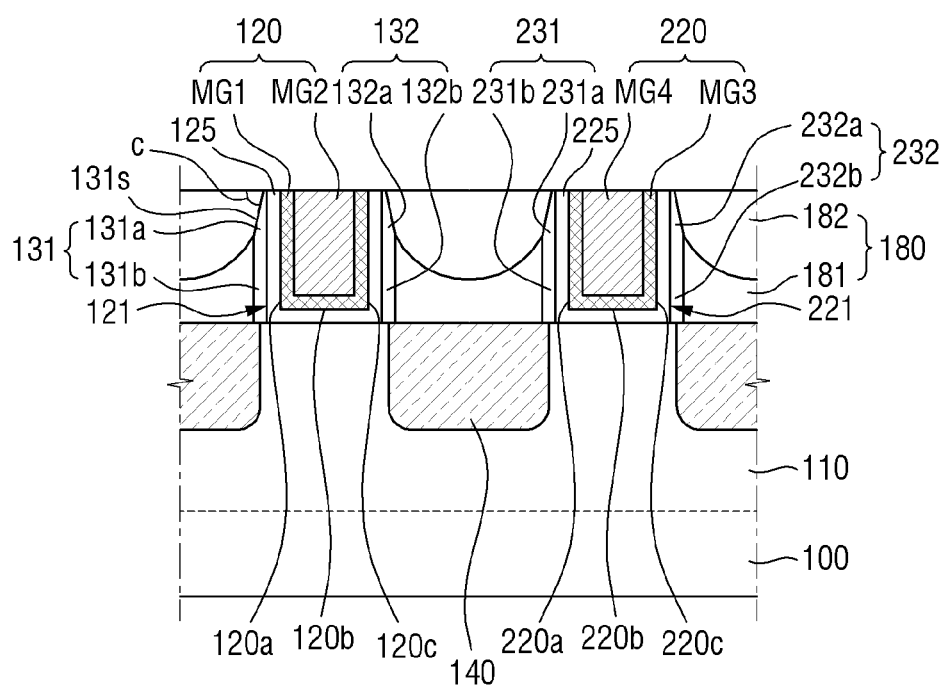
FIG. 8 is a view provided to explain a semiconductor device, according to some exemplary embodiments.

FIG. 8 is a view provided to explain a semiconductor device according to some exemplary embodiments. For convenience of explanation, differences that are not explained above with reference to FIG. 5 will be mainly explained below.

Referring to FIG. 8, in a semiconductor device according to some exemplary embodiments, the upper surfaces of the first gate spacers 131, 132 and the upper surfaces of the second gate spacers 231, 232 each may include inclined surfaces having slopes with respect to the upper surface of the upper interlayer insulating film 182.

More specifically, the upper surfaces of the upper portions 131a, 132a of the first gate spacers 131, 132 and the upper surfaces of the upper portions 231a, 232a of the second gate spacers 231, 232 each may include inclined surfaces having slopes at an acute angle with respect to the upper surface of the upper interlayer insulating film 182.

For example, the first one-side spacer 131 may include an inclined surface 131s having a slope at an acute angle with respect to the upper surface of the upper interlayer insulating film 182. The inclined surface 131s may be included in the upper portion 131a of the first one-side spacer 131. The inclined surface 131s of the first one-side spacer 131 may have a slope at a fifth angle c with respect to the upper surface of the upper interlayer insulating film 182. In this case, the fifth angle (c) may be an acute angle.

Further, each of the first other-side spacer 132, the second one-side spacer 231, and the second other-side spacer 232 may include inclined surfaces having slopes at an acute angle with respect to the upper surface of the upper interlayer insulating film 182. The inclined surfaces of the first other-side spacer 132, the second one-side spacer 231, and the second other-side spacer 232 may be included, respectively, in the upper portion 132a of the first other-side spacer 132, the upper portion 231a of the second one-side spacer 231, and the upper portion 232a of the second other-side spacer 232.

The boundary between the lower interlayer insulating film 181 and the upper interlayer insulating film 182 may have a convex shape relative to the upper surface of the substrate 100, i.e., to the upper surface of the first fin-type pattern 110, but not limited thereto. For example, the boundary between the lower interlayer insulating film 181 and the upper interlayer insulating film 182 may have a shape that is rounded or curved in a direction away from the upper surface of the substrate 100.

Figure 9:
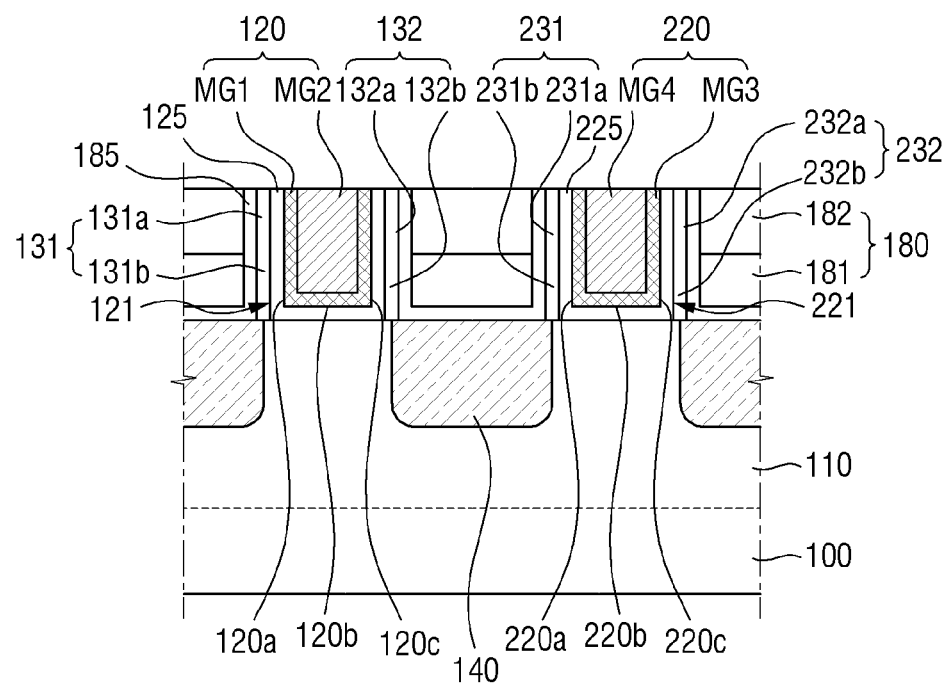
FIG. 9 is a view provided to explain a semiconductor device, according to some exemplary embodiments.

FIG. 9 is a view provided to explain a semiconductor device according to some exemplary embodiments. For convenience of explanation, differences that are not explained above with reference to FIG. 5 will be mainly explained below.

Referring to FIG. 9, the semiconductor device according to some exemplary embodiments may additionally include an etch-stop layer 185 between the interlayer insulating film 180 and the first source/drain region 140.

The etch-stop layer 185 may extend along the sidewalls of the first gate spacers 131, 132, the second gate spacers 231, 232, and the upper surface of the first source/drain region 140.

The etch-stop layer 185 may extend between the interlayer insulating film 180 and the first gate spacers 131, 132, and between the interlayer insulating film 180 and the second gate spacers 231, 232.

For example, the etch-stop layer 185 may be formed by extending from between the lower interlayer insulating film 181 and a top surface of the first source/drain region 140, to between the lower interlayer insulating film 181 and the lower portions 131b, 132b of the first gate spacers, and then between the upper interlayer insulating film 182 and the upper portions 131a, 132a of the first gate spacers.

A portion of the etch-stop layer 185 extending along the sidewalls of the first gate spacers 131, 132 and the sidewalls of the second gate spacers 231, 232 may extend up to the height of the upper surface of the upper interlayer insulating film 182.

The lower interlayer insulating film 181 and the upper interlayer insulating film 182 may be stacked in a sequential order on the substrate 100 where the etch-stop layer 185 is formed. For example, the etch-stop layer 185 may be disposed on the first source/drain region 140, the lower interlayer insulating film 181 may be disposed on the etch-stop layer 185, and the upper interlayer insulating film 182 may be disposed on the lower interlayer insulating film 181.

In some embodiments, the etch-stop layer 185 may include at least one of silicon nitride (SiN), silicon oxynitride (SiON), silicon oxide (SiO$_2$), silicon oxycarbonitride (SiOCN), silicon carbonitride (SiCN), and a combination thereof, but not limited thereto.

Figure 10:
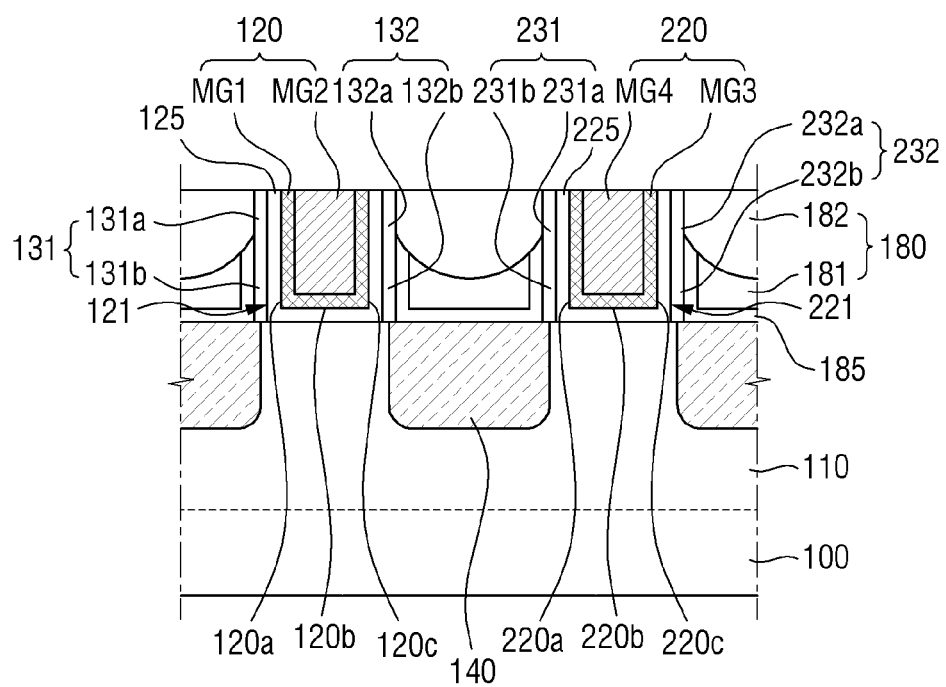
FIG. 10 is a view provided to explain a semiconductor device, according to some exemplary embodiments.

FIG. 10 is a view provided to explain a semiconductor device according to some exemplary embodiments. For convenience of explanation, differences that are not explained above with reference to FIG. 9 will be mainly explained below.

Referring to FIG. 10, in a semiconductor device according to some exemplary embodiments, the upper interlayer insulating film 182 may cover the uppermost portion of the etch-stop layer 185.

The etch-stop layer 185 may extend between the lower interlayer insulating film 181 and the lower portions 131b, 132b of the first gate spacers, and between the lower interlayer insulating film 181 and the lower portions 231b, 232b of the second gate spacers.

However, the etch-stop layer 185 may not extend between the upper interlayer insulating film 182 and the upper portions 131a, 132a of the first gate spacers 131, 132, and between the upper interlayer insulating film 182 and the upper portions 231a, 232a of the second gate spacers 231, 232.

A portion of the etch-stop layer 185 extending along the sidewalls of the first gate spacers 131, 132 and the sidewalls of the second gate spacers 231, 232 do not extend up to the height of the upper surfaces of the first gate spacers 131, 132 and the upper surfaces of the second gate spacers 231, 232. In some embodiments, the upper interlayer insulating film 182 may extend over an upper end surface of the etch-stop layer 185 in regions near the upper portions 131a, 132a of the first gate spacers 131, 132 and in regions near the upper portions 231a, 232a of the second gate spacers 231, 232.

The height from the upper surface of the substrate 100 to the uppermost portion of the etch-stop layer 185 is less than the height from the upper surface of the substrate 100 to the upper surface of the upper interlayer insulating film 182.

The boundary between the lower interlayer insulating film 181 and the upper interlayer insulating film 182 may have a convex shape to the upper surface of the substrate 100, i.e., to the upper surface of the first fin-type pattern 110, but is not limited thereto. For example, the boundary between the lower interlayer insulating film 181 and the upper interlayer insulating film 182 may have a shape that is rounded or curved in a direction toward the upper surface of the substrate 100.

Figure 11:
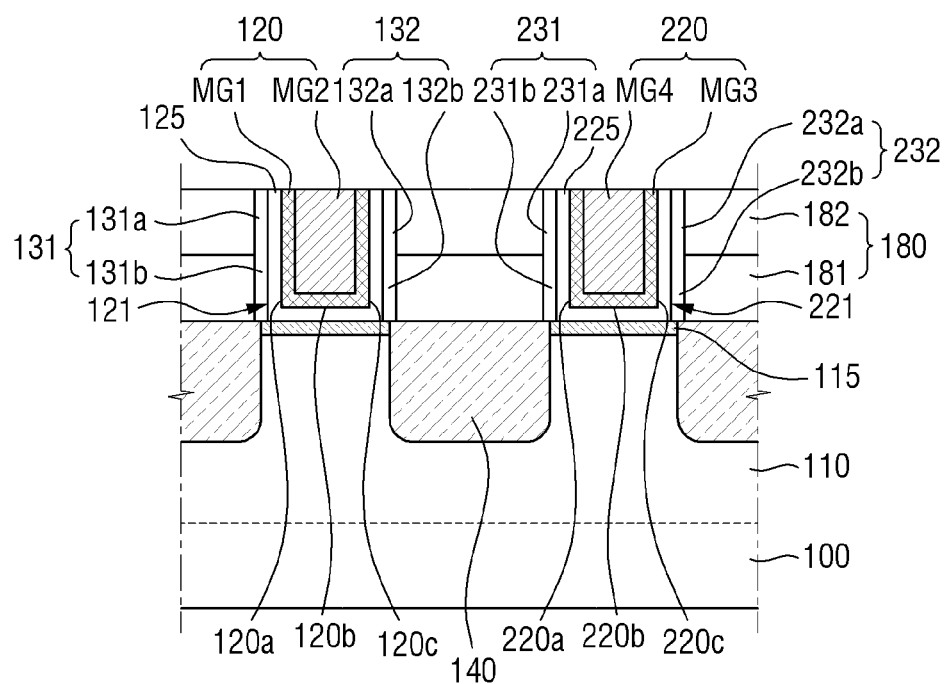
FIG. 11 is a view provided to explain a semiconductor device, according to some exemplary embodiments.

FIG. 11 is a view provided to explain a semiconductor device according to some exemplary embodiments. For convenience of explanation, differences that are not explained above with reference to FIG. 5 will be mainly explained below.

Referring to FIG. 11, a semiconductor device according to some exemplary embodiments may additionally include a channel layer 115 formed between the first fin-type pattern 110 and the first gate electrode 120, and between the first fin-type pattern 110 and the second gate electrode 220.

The channel layer 115 may be formed between the first fin-type pattern 110 and the first gate insulating film 125, and between the first fin-type pattern 110 and the second gate insulating film 225.

For example, the channel layer 115 may be formed on the upper surface of the first fin-type pattern 110, and below bottom surfaces of the first gate insulating film 125 and the second gate insulating film 225.

The channel layer 115 may include a material which is different from the material that forms the first fin-type pattern 110. For example, if the first fin-type pattern 110 is a silicon fin-type pattern, the channel layer 115 may include silicon germanium which has a greater lattice constant than silicon.

Alternatively, if the first fin-type pattern 110 is a silicon germanium fin-type pattern, the channel layer 115 may include, for example, silicon germanium or germanium which has a greater lattice constant than the silicon germanium included in the first fin-type pattern 110. Alternatively, the channel layer 115 may include silicon having a smaller lattice constant than the silicon germanium.

Figure 12:
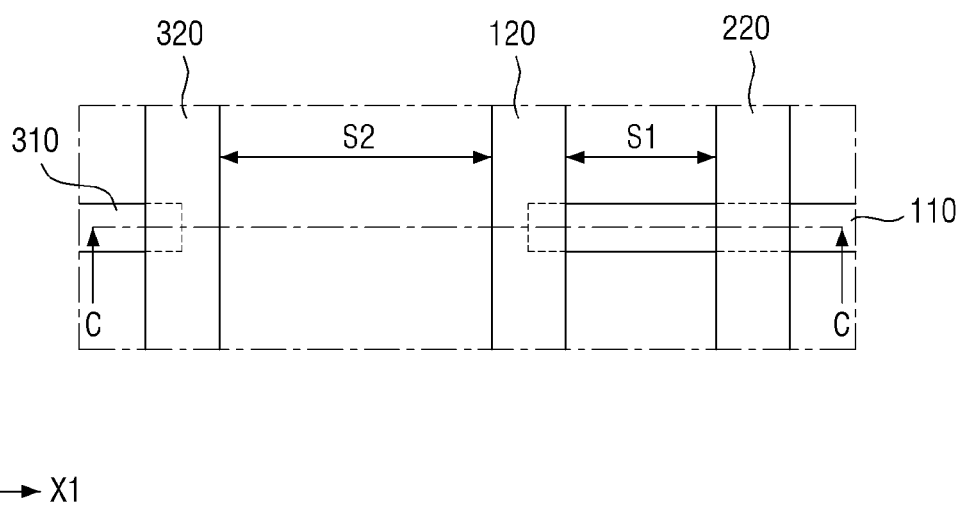
FIG. 12 is a top view provided to explain a semiconductor device, according to some exemplary embodiments.
Figure 13:
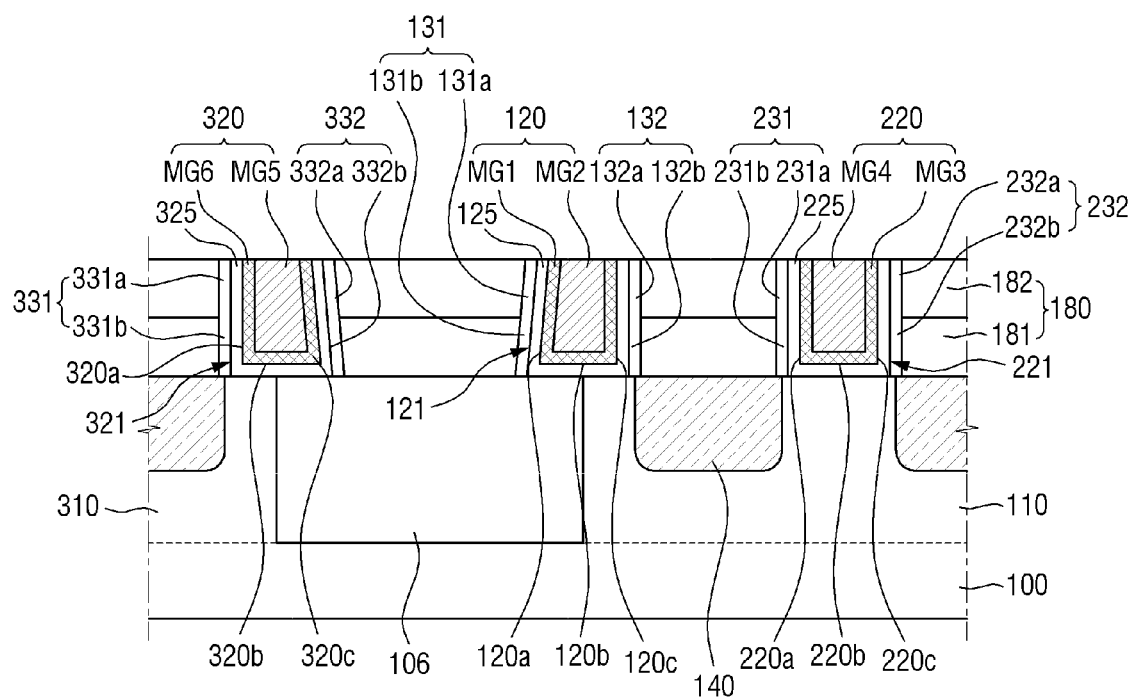
FIG. 13 is a cross sectional view taken on line C-C of FIG. 12, according to certain disclosed embodiments.

FIG. 12 is a top view provided to explain a semiconductor device according to some exemplary embodiments. FIG. 13 is a cross sectional view taken on line C-C of FIG. 12. For convenience of explanation, differences that are not explained above with reference to FIGS. 1 to 4B will be mainly explained below.

Referring to FIGS. 12 and 13, a semiconductor device according to some exemplary embodiments may additionally include a second fin-type pattern 310, a third gate electrode 320, and third gate spacers 331, 332.

The second fin-type pattern 310 may protrude from the substrate 100. The second fin-type pattern 310 may extend longitudinally in a first direction X1.

The first fin-type pattern 110 and the second fin-type pattern 310 may be aligned in the first direction X1. The short side of the first fin-type pattern 110 and the short side of the second fin-type pattern 310 may be opposed to each other. For example, a short end side of the first fin-type pattern 110 may be adjacent to and face a short end side of the second fin-type pattern 310.

The second field insulating film 106 may be formed between the first fin-type pattern 110 and the second fin-type pattern 310. The upper surface of the second field insulating film 106 disposed between the short side of the first fin-type pattern 110 and the short side of the second fin-type pattern 310 may be placed on the same plane as the upper surface of the first fin-type pattern 110 and the upper surface of the second fin-type pattern 310, or it may be higher. For example, the topmost upper surface of the second field insulating film 106 may be on the same plane as the topmost upper surface of the first fin-type pattern 110 and the topmost upper surface of the second fin-type pattern 310.

Although not illustrated in FIGS. 12 and 13, the upper surface of the second field insulating film 106 disposed between the short side of the first fin-type pattern 110 and the short side of the second fin-type pattern 310 may be higher than the upper surface of the first field insulating film 105, as illustrated in FIG. 4A, disposed at the long side of the first fin-type pattern 110.

FIG. 13 illustrates the upper surface of the second field insulating film 106 being a flat or planar surface, but this is only for illustrative purpose and the embodiments are not limited thereto. At least a portion of the upper surface of the second field insulating film 106 between the first gate electrode 120 and the third gate electrode 320 may be recessed from the upper surface of the second field insulating film 106 which overlaps with the first gate electrode 120. In some embodiments, at least a portion of the upper surface of the second field insulating film 106 may be convex or concave.

The first gate electrode 120 may be formed on the first fin-type pattern 110 and the second field insulating film 106. For example, a portion of the first gate electrode 120 may intersect or cross over the first fin-type pattern 110, and the rest of the first gate electrode 120 may be formed on the second field insulating film 106. For example, the first gate electrode 120 may be formed on an end portion of the first fin-type pattern 110.

The third gate electrode 320 may be formed on the second fin-type pattern 310 and the second field insulating film 106. A portion of the third gate electrode 320 may intersect or cross over the second fin-type pattern 310, and the rest of the third gate electrode 320 may be formed on the second field insulating film 106. For example, the third gate electrode 320 may be formed on an end portion of the second fin-type pattern 310.

The third gate electrode 320 may include a first sidewall 320a and a second sidewall 320c opposed to each other. The third gate electrode 320 may include a bottom surface 320b which connects the first sidewall 320a of the third gate electrode with the second sidewall 320c of the third gate electrode, and extends along at least a portion of the upper surface of the second fin-type pattern 310 and at least a portion of the upper surface of the second field insulating film 106.

The third gate electrode 320 may include metal layers MG5, MG6. For example, the third gate electrode 320 may include a stack of two or more metal layers MG5, MG6, as illustrated.

No additional gate electrode may be formed between the first gate electrode 120 and the second gate electrode 220, and between the first gate electrode 120 and the third gate electrode 320. For example, the second gate electrode 220 and the third gate electrode 320 may be the gate electrodes that are most adjacent to the first gate electrode 120.

The distance S1 between the first gate electrode 120 and the second gate electrode 220 may be different from the distance S2 between the first gate electrode 120 and the third gate electrode 320. For example, the distance S1 between the first gate electrode 120 and the second gate electrode 220 may be greater than the distance S2 between the first gate electrode 120 and the third gate electrode 320.

The third gate spacers 331, 332 may be disposed on sidewalls of the third gate electrode 320. The third gate spacers 331, 332 may include a third one-side spacer 331 disposed on the first sidewall 320a of the third gate electrode, and a third other-side spacer 332 disposed on the second sidewall 320c of the third gate electrode.

The third one-side spacer 331 and the third other-side spacer 332 may define a third trench 321. The third gate electrode 320 may be formed by filling the third trench 321 defined by the third gate spacers 331, 332.

The third one-side spacer 331 may include the lower portion 331b and the upper portion 331a, and the third other-side spacer 332 may include the lower portion 332b and the upper portion 332a.

The third gate insulating film 325 may be formed along the sidewall and the bottom surface of the third trench 321. The third gate electrode 320 may be formed on the third gate insulating film 325.

The lower interlayer insulating film 181 may overlap with the lower portions 331b, 332b of the third gate spacers 331, 332. For example, the lower interlayer insulating film 181 may be adjacent to the lower portions 331b, 332b of the third gate spacers 331, 332. The lower interlayer insulating film 181 may surround the lower portion 331b of the third one-side spacer 331 and the sidewall of the lower portion 332b of the third other-side spacer 332.

The upper interlayer insulating film 182 may overlap with the upper portions 331a, 332a of the third gate spacers 331, 332. The upper interlayer insulating film 182 may surround the upper portion 331a of the third one-side spacer 331 and the sidewall of the upper portion 332a of the third other-side spacer 332.

The lower interlayer insulating film 181 may not be interposed between the upper interlayer insulating film 182 and the upper portions 331a, 332a of the third gate spacers 331, 332.

In FIG. 13, the first sidewall 220a of the second gate electrode and the second sidewall 220c of the second gate electrode 220 may have slopes at a right angle with respect to the bottom surface 220b of the second gate electrode 220.

Further, the second sidewall 120c of the first gate electrode 120, which is closer to the second gate electrode 220 than the first sidewall 120a of the first gate electrode 120, may also have a slope at a right angle with respect to the bottom surface 120b of the first gate electrode 120.

However, the first sidewall 120a of the first gate electrode 120 may have a slope at an acute angle with respect to the bottom surface 120b of the first gate electrode 120.

Due to difference in the distance S1 between the first gate electrode 120 and the second gate electrode 220 and the distance S2 between the first gate electrode 120 and the third gate electrode 320, the slope of the first sidewall 120a of the first gate electrode and the slope of the second sidewall 120c of the first gate electrode may be different from each other.

For example, because the volume of the upper interlayer insulating film 182 formed closer to the first one-side spacer 131 is different from the volume of the upper interlayer insulating film 182 formed closer to the first other-side spacer 132, the slope of the first sidewall 120a of the first gate electrode 120 and the slope of the second sidewall 120c of the first gate electrode 120 may be different.

In FIG. 13, the second sidewall 320c of the third gate electrode 320 adjacent to the first gate electrode 120 may have a slope at an acute angle with respect to the bottom surface 320b of the third gate electrode 320, and unlike the second sidewall 320c of the third gate electrode 320, the first sidewall 320a of the third gate electrode 320 may have a slope at a right angle, although exemplary embodiments are not limited thereto.

The slope of the first sidewall 320a of the third gate electrode 320 and the slope of the second sidewall 320c of the third gate electrode 320 with respect to the bottom surface 320b of the third gate electrode 320 may vary according to a distance between the gate electrode adjacent to the third one-side spacer 331 and the third gate electrode 320.

Meanwhile, although it is illustrated that the second field insulating film 106 is formed between the first fin-type pattern 110 and the second fin-type pattern 310, exemplary embodiments are not limited thereto. Of course, the first fin-type pattern 110 and the second fin-type pattern 310 may be one integrated fin-type pattern.

Figure 14:
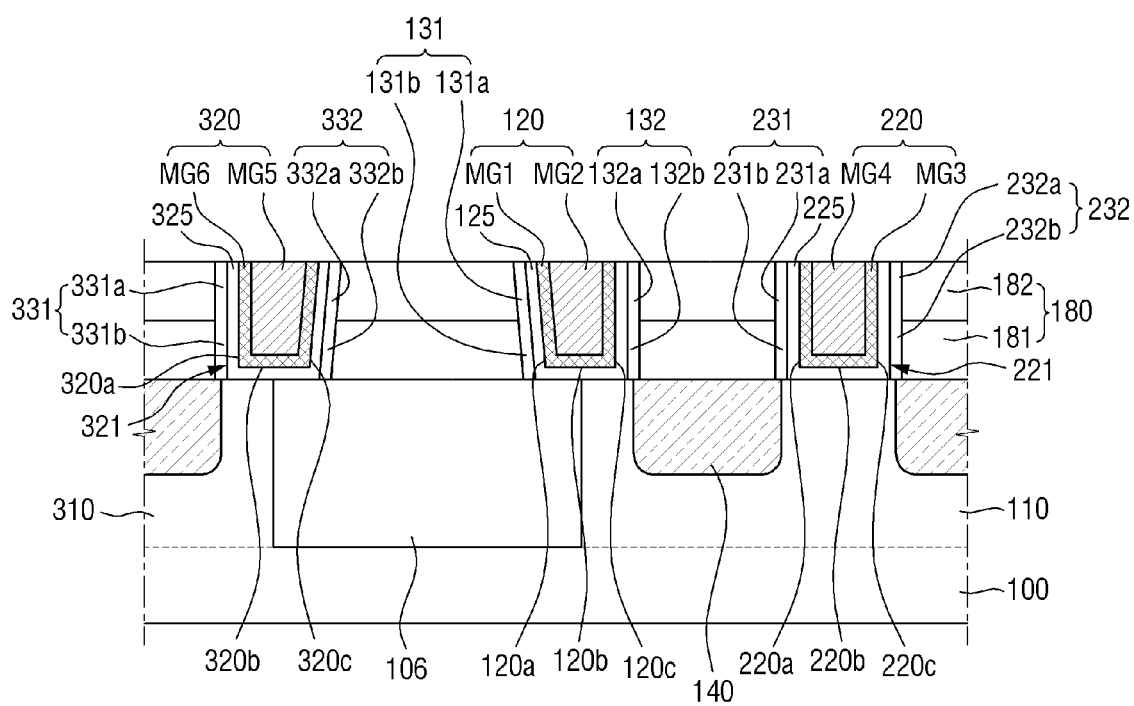
FIG. 14 is a view provided to explain a semiconductor device, according to some exemplary embodiments.
Figure 15:
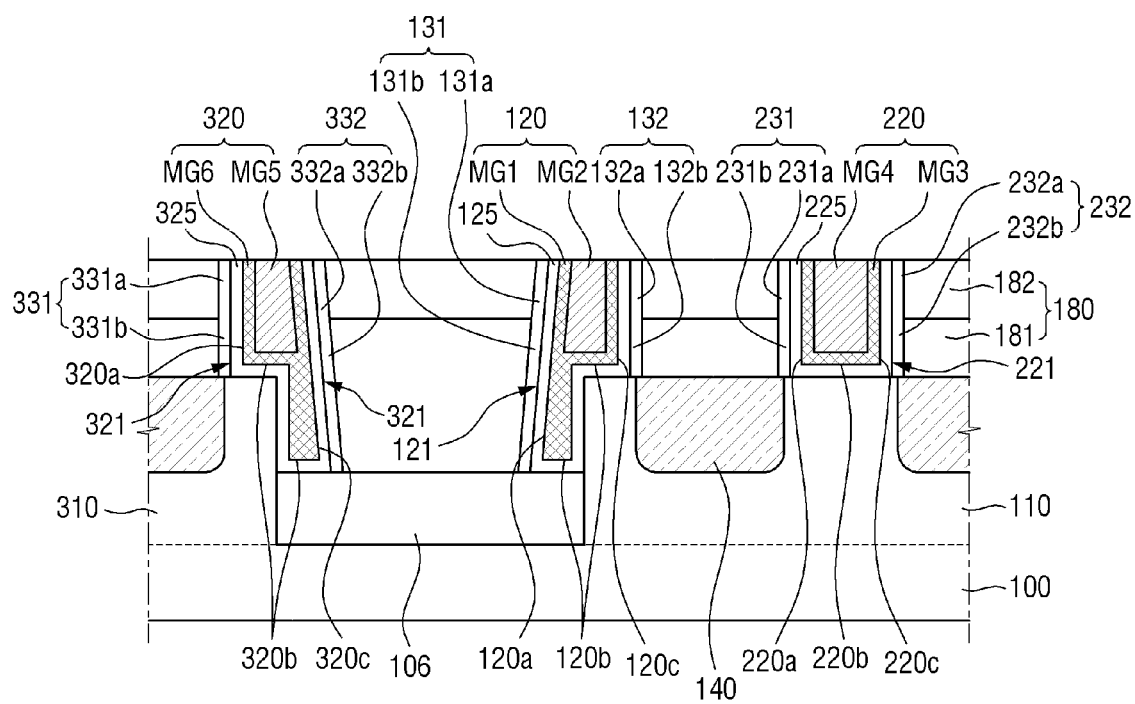
FIG. 15 is a view provided to explain a semiconductor device, according to some exemplary embodiments.

FIG. 14 is a view provided to explain a semiconductor device according to some exemplary embodiments. FIG. 15 is a view provided to explain a semiconductor device according to some exemplary embodiments. For convenience of explanation, differences that are not explained above with reference to FIGS. 12 and 13 will be mainly explained below.

Referring to FIG. 14, in a semiconductor device according to some exemplary embodiments, the first sidewall 120a of the first gate electrode 120 may have a slope at an obtuse angle with respect to the bottom surface 120b of the first gate electrode 120.

However, the second sidewall 120c of the first gate electrode 120, which is closer to the second gate electrode 220 than the first sidewall 120a of the first gate electrode 120, may have a slope at a right angle with respect to the bottom surface 120b of the first gate electrode 120.

Further, the first sidewall 220a of the second gate electrode 220 and the second sidewall 220c of the second gate electrode 220 may have slopes at a right angle with respect to the bottom surface 220b of the second gate electrode 220.

Referring to FIG. 15, in a semiconductor device according to some exemplary embodiments, the upper surface of the second field insulating film 106 may be lower than the upper surface of the first fin-type pattern 110 and the upper surface of the second fin-type pattern 310.

Accordingly, in some embodiments, the first gate electrode 120 may be formed to surround an end of the first fin-type pattern 110 which protrudes upward higher than the second field insulating film 106, and the third gate electrode 320 may be formed to surround an end of the second fin-type pattern 310 which protrudes upward higher than the second field insulating film 106.

However, unlike the illustration, in some embodiments, the second field insulating film 106 may include a protruding portion at a contact portion with the short side of the first fin-type pattern 110 or the short side of the second fin-type pattern 310. The upper surface of the protruding portion may be on the same plane as the upper surface of the first fin-type pattern 110 and the upper surface of the second fin-type pattern 310, or it may be higher.

Figure 16:
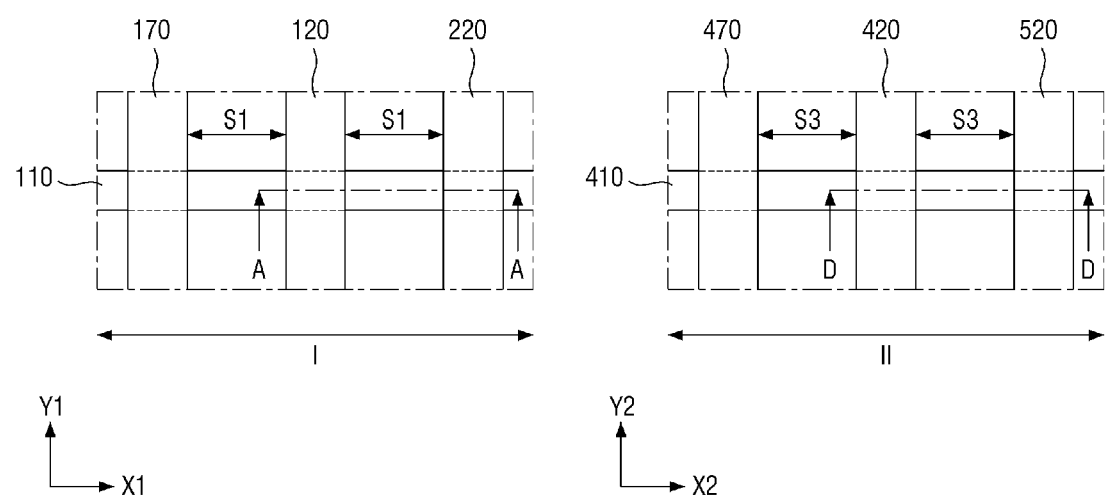
FIG. 16 is a top view provided to explain a semiconductor device, according to some exemplary embodiments.
Figure 17:
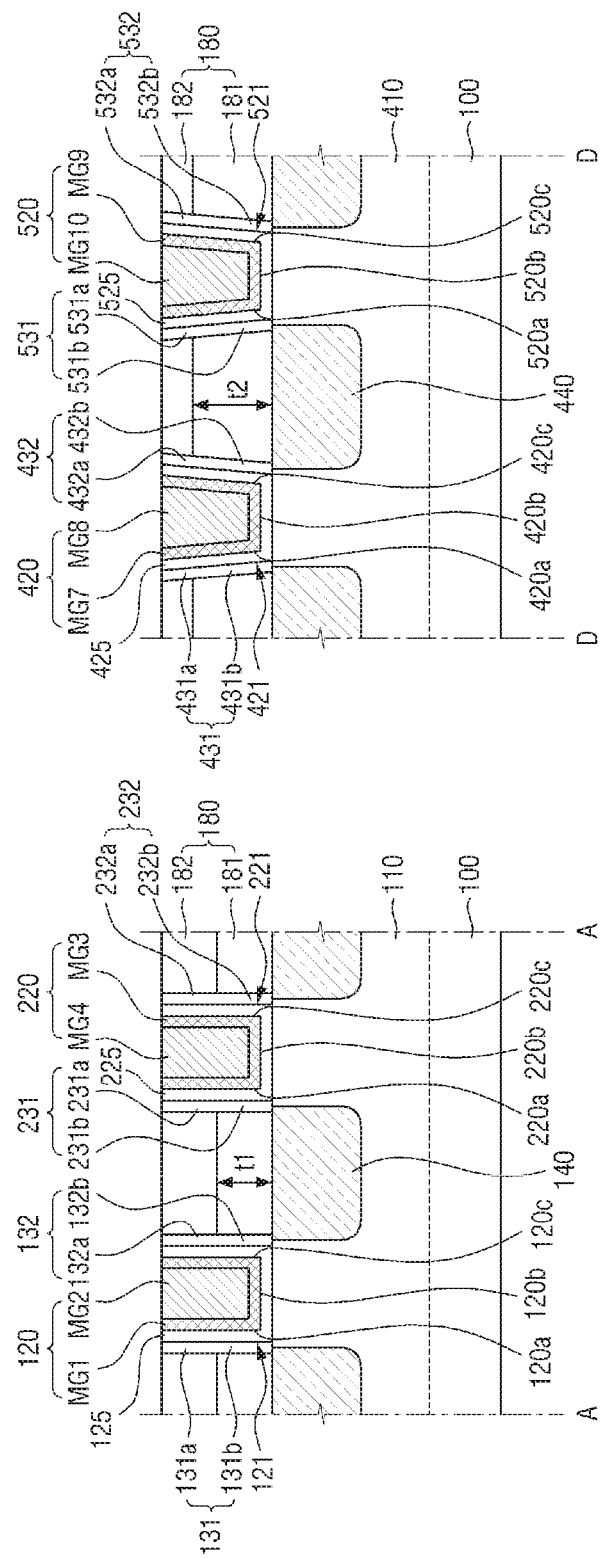
FIG. 17 are cross sectional views taken on lines A-A and D-D of FIG. 16, according to certain disclosed embodiments.

FIG. 16 is a top view provided to explain a semiconductor device according to some exemplary embodiments. FIG. 17 is a cross sectional views taken on lines A-A and D-D of FIG. 16.

For reference, the cross sectional view taken on line A-A of FIG. 17 is illustrated in a similar manner as the view of FIG. 5 for convenience of explanation only. Accordingly, exemplary embodiments are not limited to such illustration. Further, for convenience of explanation, elements or operations redundant to those already described above with reference to FIGS. 1 to 11 will not be described or will be described succinctly for the sake of brevity.

Referring to FIGS. 16 and 17, the semiconductor device according to some exemplary embodiments may include a first fin-type pattern 110, a first gate electrode 120, a second gate electrode 220, first gate spacers 131, 132, second gate spacers 231, 232, a third fin-type pattern 410, a fourth gate electrode 420, a fifth gate electrode 520, fourth gate spacers 431, 432, fifth gate spacers 531, 532, a lower interlayer insulating film 181, and an upper interlayer insulating film 182.

The substrate 100 may include a first region I and a second region II. The first region I and the second region II may be spaced from each other and/or connected with each other.

In the first region I, the first fin-type pattern 110, the first gate electrode 120, the second gate electrode 220, the first gate spacers 131, 132, and the second gate spacers 231, 232 may be formed.

In the first region I, a sixth gate electrode 170 intersecting the first fin-type pattern 110 may be additionally formed. For example, the sixth gate electrode 170 may be formed to pass over or cross the first fin-type pattern 110. The first gate electrode 120 may be disposed between the second gate electrode 220 and the sixth gate electrode 170.

In some exemplary embodiments, the distance S1 between the first gate electrode 120 and the second gate electrode 220 may be same as the distance between the first gate electrode 120 and the sixth gate electrode 170. No other gate electrode intersecting the first fin-type pattern 110 may be formed between the sixth gate electrode 170 and the first gate electrode 120.

In the second region II, the third fin-type pattern 410, the fourth gate electrode 420, the fifth gate electrode 520, the fourth gate spacers 431, 432 and the fifth gate spacers 531, 532 may be formed.

The third fin-type pattern 410 may protrude from the substrate 100. The third fin-type pattern 410 may extend longitudinally in a third direction X2.

The fourth gate electrode 420 may extend in a fourth direction Y2. The fourth gate electrode 420 may be formed on the third fin-type pattern 410 so as to intersect the third fin-type pattern 410.

The fourth gate electrode 420 may include a first sidewall 420a and a second sidewall 420c opposed to each other. The fourth gate electrode 420 may include a bottom surface 420b which connects the first sidewall 420a of the fourth gate electrode with the second sidewall 420c of the fourth gate electrode, and extends along the upper surface of the third fin-type pattern 410.

The fifth gate electrode 520 may extend in the fourth direction Y2. The fifth gate electrode 520 may be formed on the third fin-type pattern 410 so as to intersect the third fin-type pattern 410. For example, the fifth gate electrode 520 may be formed to pass over or cross the third fin-type pattern 410.

No other gate electrode intersecting the third fin-type pattern 410 may be formed between the fifth gate electrode 520 and the fourth gate electrode 420.

The fifth gate electrode 520 may include a first sidewall 520a and a second sidewall 520c opposed to each other. The fifth gate electrode 520 may include a bottom surface 520b which connects the first sidewall 520a of the fifth gate electrode 520 with the second sidewall 520c of the fifth gate electrode 520, and extends along the upper surface of the third fin-type pattern 410.

The fourth gate electrode 420 may include metal layers MG7, MG8, and the fifth gate electrode 520 may include metal layers MG9, MG10. As illustrated, the fourth gate electrode 420 and the fifth gate electrode 520 may be stacks of two or more metal layers.

In the second region II, a seventh gate electrode 470 intersecting the third fin-type pattern 410 may be additionally formed. The seventh gate electrode 470 may be formed to pass over or cross the third fin-type pattern 410. The fourth gate electrode 420 may be disposed between the fifth gate electrode 520 and the seventh gate electrode 470.

The distance S3 between the fourth gate electrode 420 and the fifth gate electrode 520 may be same as the distance between the fourth gate electrode 420 and the seventh gate electrode 470. No other gate electrode intersecting the third fin-type pattern 410 may be formed between the seventh gate electrode 470 and the fourth gate electrode 420.

Additionally, in FIG. 16, the distance S1 between the first gate electrode 120 and the second gate electrode 220 may be substantially equal to the distance S3 between the fourth gate electrode 420 and the fifth gate electrode 520.

The fourth gate spacers 431, 432 may include a fourth one-side spacer 431 disposed on the first sidewall 420a of the fourth gate electrode, and a fourth other-side spacer 432 disposed on the second sidewall 420c of the fourth gate electrode. The fourth one-side spacer 431 and the fourth other-side spacer 432 may define a fourth trench 421.

The fourth one-side spacer 431 may include a lower portion 431b and an upper portion 431a, and the fourth other-side spacer 432 may include a lower portion 432b and an upper portion 432a.

The fifth gate spacers 531, 532 may include a fifth one-side spacer 531 disposed on the first sidewall 520a of the fifth gate electrode 520, and a fifth other-side spacer 532 disposed on the second sidewall 520c of the fifth gate electrode 520.

The fifth one-side spacer 531 and the fifth other-side spacer 532 may define a fifth trench 521.

The fifth one-side spacer 531 may include a lower portion 531b and an upper portion 531a, and the fifth other-side spacer 532 may include a lower portion 532b and an upper portion 532a.

The fourth gate insulating film 425 may be formed along the sidewall and the bottom surface of the fourth trench 421, and the fifth gate insulating film 525 may be formed along the sidewall and the bottom surface of the fifth trench 521.

The lower interlayer insulating film 181 may overlap with the lower portions 431b, 432b of the fourth gate spacers 431, 432, and with the lower portions 531b, 532b of the fifth gate spacers 531, 532. The lower interlayer insulating film 181 may surround sidewalls of the lower portion 431b of the fourth one-side spacer 431, the lower portion 432b of the fourth other-side spacer 432, the lower portion 531b of the fifth one-side spacer 531, and the lower portion 532b of the fifth other-side spacer 532.

The upper interlayer insulating film 182 may overlap with the upper portions 431a, 432a of the fourth gate spacers 431, 432, and with the upper portions 531a, 532a of the fifth gate spacers 531, 532. The upper interlayer insulating film 182 may surround sidewalls of the upper portion 431a of the fourth one-side spacer 431, the upper portion 432a of the fourth other-side spacer 432, the upper portion 531a of the fifth one-side spacer 531, and the upper portion 532a of the fifth other-side spacer 532.

The lower interlayer insulating film 181 is not interposed between the upper interlayer insulating film 182 and the upper portions 431a, 432a of the fourth gate spacers 431, 432, nor between the upper interlayer insulating film 182 and the upper portions 531a, 532a of the fifth gate spacers 531, 532.

In the embodiment disclosed hereinbelow, the lower interlayer insulating film 181 may have the tensile stress characteristic, and the upper interlayer insulating film 182 may have the compressive stress characteristic.

Referring to FIG. 17, the height from the upper surface of the first fin-type pattern 110 to the upper surface of the upper interlayer insulating film 182 in the first region I may be substantially equal to the height from the upper surface of the third fin-type pattern 410 to the upper surface of the upper interlayer insulating film 182 in the second region II.

The upper surface of the first gate electrode 120 and the upper surface of the second gate electrode 220 may be placed on the same plane as the upper surface of the upper interlayer insulating film 182, and the upper surface of the fourth gate electrode 420 and the upper surface of the fifth gate electrode 520 may be placed on the same plane as the upper surface of the upper interlayer insulating film 182.

Further, the thickness t1 of the lower interlayer insulating film 181 in the first region I may be different from the thickness t2 of the lower interlayer insulating film 181 in the second region II. For example, the thickness t1 of the lower interlayer insulating film 181 in the first region I may be thinner than the thickness t2 of the lower interlayer insulating film 181 in the second region II.

For example, the thickness of the upper interlayer insulating film 182 in the first region I may be thicker than the thickness of the upper interlayer insulating film 182 in the second region II. In some embodiments, however, the thickness of the upper interlayer insulating film 182 in the second region II may be thicker than the thickness of the upper interlayer insulating film 182 in the first region I.

The ratio of the thickness of the upper interlayer insulating film 182 to the thickness of the lower interlayer insulating film 181 in the first region I may be different from the ratio of the thickness of the upper interlayer insulating film 182 to the thickness of the lower interlayer insulating film 181 in the second region II.

For example, the ratio of the thickness of the upper interlayer insulating film 182 to the thickness of the lower interlayer insulating film 181 in the first region I may be greater than the ratio of the thickness of the upper interlayer insulating film 182 to the thickness of the lower interlayer insulating film 181 in the second region II.

The slopes of the sidewalls 120a, 120c of the first gate electrode 120 relative to the bottom surface 120b of the first gate electrode 120 may be different from the slopes of the sidewalls 420a, 420c of the fourth gate electrode 420 relative to the bottom surface 420b of the fourth gate electrode 420.

In FIG. 17, the first sidewall 120a of the first gate electrode and the second sidewall 120c of the first gate electrode may have slopes at a right angle with respect to the bottom surface 120b of the first gate electrode 120.

However, the first sidewall 420a of the fourth gate electrode 420 and the second sidewall 420c of the fourth gate electrode 420 may have an obtuse angle with respect to the bottom surface 420b of the fourth gate electrode 420.

The angles of the sidewalls 420a, 420c of the fourth gate electrode 420 relative to the bottom surface 420b of the fourth gate electrode 420 may be greater than the angles of the sidewalls 120a, 120c of the first gate electrode 120 relative to the bottom surface 120b of the first gate electrode 120.

For example, as the distance from the upper surface of the substrate 100 increases, the width of the first gate electrode 120 may remain substantially constant, but the width of the fourth gate electrode 420 may increase.

Because the thickness of the upper interlayer insulating film 182 having the compressive stress characteristic in the first region I is thicker than the thickness of the upper interlayer insulating film 182 having the compressive stress characteristic in the second region II, the angles of the sidewalls 420a, 420c of the fourth gate electrode 420 relative to the bottom surface 420b of the fourth gate electrode 420 may be greater than the angles of the sidewalls 120a, 120c of the first gate electrode 120 relative to the bottom surface 120b of the first gate electrode 120.

Unlike the illustration, the first sidewall 120a of the first gate electrode 120 and the second sidewall 120c of the first gate electrode 120 may have slopes at an acute angle with the bottom surface 120b of the first gate electrode 120.

Contrary to the embodiment described above, it is assumed that the lower interlayer insulating film 181 has the compressive stress characteristic, and the upper interlayer insulating film 182 has the tensile stress characteristic.

When the first sidewall 120a of the first gate electrode 120 and the second sidewall 120c of the first gate electrode 120 have slopes at a right angle with the bottom surface 120b of the first gate electrode 120, the first sidewall 420a of the fourth gate electrode 420 and the second sidewall 420c of the fourth gate electrode 420 may make an acute angle with the bottom surface 420b of the fourth gate electrode 420.

Figure 18:
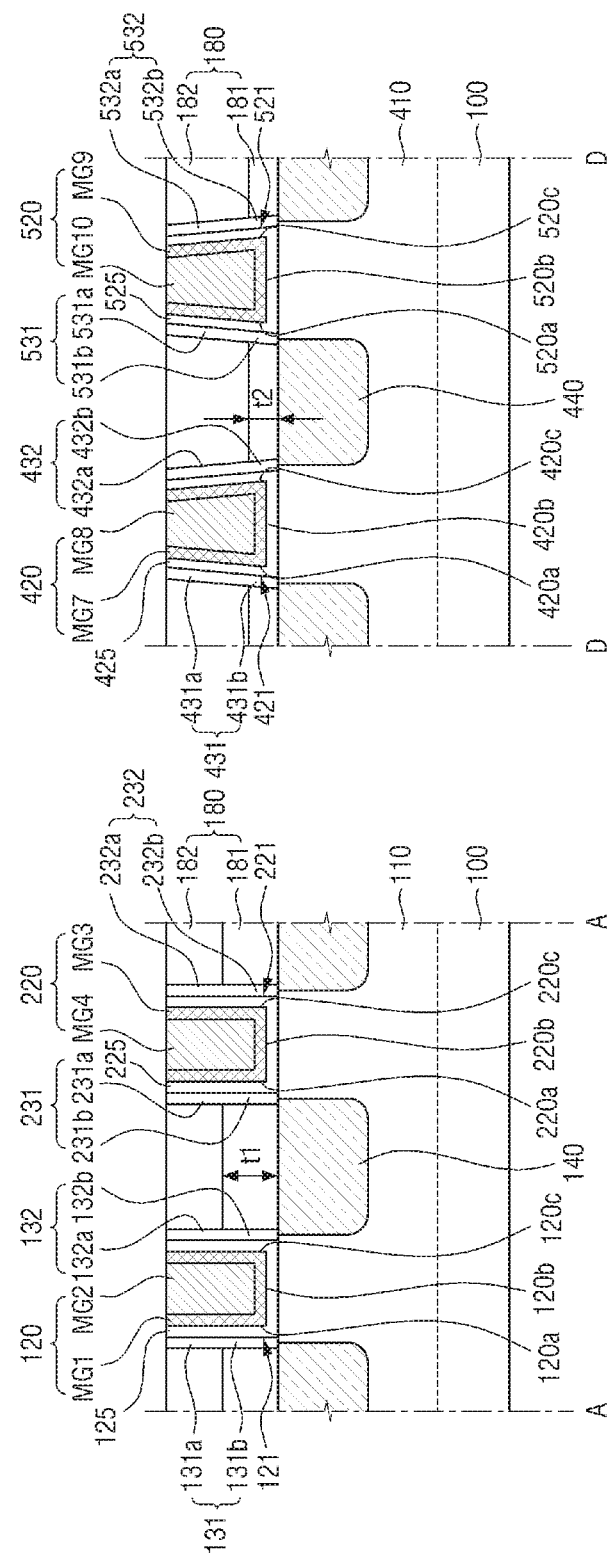
FIG. 18 is a view provided to explain a semiconductor device, according to some exemplary embodiments.

FIG. 18 is a view provided to explain a semiconductor device according to some exemplary embodiments. For convenience of explanation, differences that are not explained above with reference to FIGS. 16 and 17 will be mainly explained below.

Referring to FIG. 18, the thickness t1 of the lower interlayer insulating film 181 in the first region I may be thicker than the thickness t2 of the lower interlayer insulating film 181 in the second region II.

For example, the thickness of the upper interlayer insulating film 182 in the first region I may be thinner than the thickness of the upper interlayer insulating film 182 in the second region II.

In some embodiments, the ratio of the thickness of the upper interlayer insulating film 182 to the thickness of the lower interlayer insulating film 181 in the first region I may be smaller than the ratio of the thickness of the upper interlayer insulating film 182 to the thickness of the lower interlayer insulating film 181 in the second region II.

In some embodiments, the lower interlayer insulating film 181 may have the tensile stress characteristic, and the upper interlayer insulating film 182 may have the compressive stress characteristic.

Thus, in some embodiments, because the thickness of the upper interlayer insulating film 182 having the compressive stress characteristic in the first region I is thinner than the thickness of the upper interlayer insulating film 182 having the compressive stress characteristic in the second region II, the angles of the sidewalls 420a, 420c of the fourth gate electrode 420 relative to the bottom surface 420b of the fourth gate electrode 420 may be smaller than the angles of the sidewalls 120a, 120c of the first gate electrode 120 relative to the bottom surface 120b of the first gate electrode 120.

For example, the first sidewall 120a of the first gate electrode 120 and the second sidewall 120c of the first gate electrode 120 may have slopes at a right angle with respect to the bottom surface 120b of the first gate electrode 120.

However, the first sidewall 420a of the fourth gate electrode 420 and the second sidewall 420c of the fourth gate electrode 420 may have slopes at an acute angle with respect to the bottom surface 420b of the fourth gate electrode 420.

For example, as the distance from the upper surface of the substrate 100 increases, the width of the first gate electrode 120 may remain substantially constant, but the width of the fourth gate electrode 420 may decrease as the distance from the upper surface of the substrate 100 increases.

Unlike the illustration, the first sidewall 120a of the first gate electrode 120 and the second sidewall 120c of the first gate electrode 120 may have slopes at an obtuse angle with respect to the bottom surface 120b of the first gate electrode 120.

In other embodiments, the lower interlayer insulating film 181 may have the compressive stress characteristic, and the upper interlayer insulating film 182 may have the tensile stress characteristic.

Thus, in some embodiments, when the first sidewall 120a of the first gate electrode 120 and the second sidewall 120c of the first gate electrode 120 have slopes at a right angle with the bottom surface 120b of the first gate electrode 120, the first sidewall 420a of the fourth gate electrode 420 and the second sidewall 420c of the fourth gate electrode 420 may make an obtuse angle with the bottom surface 420b of the fourth gate electrode 420.

Figure 19:
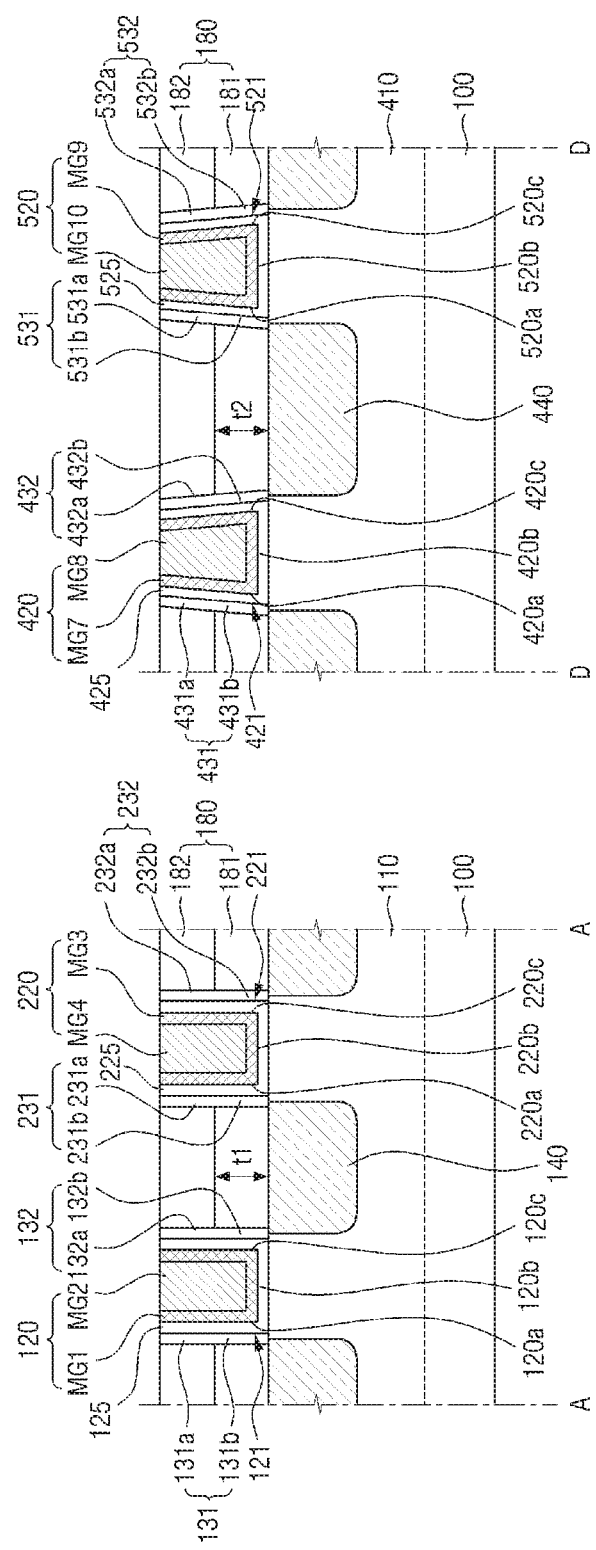
FIG. 19 is a view provided to explain a semiconductor device, according to some exemplary embodiments.

FIG. 19 is a view provided to explain a semiconductor device according to some exemplary embodiments. For convenience of explanation, differences that are not explained above with reference to FIGS. 16 and 17 will be mainly explained below.

Referring to FIG. 19, in a semiconductor device according to some exemplary embodiments, the distance S1 between the first gate electrode 120 and the second gate electrode 220 may be different than the distance S3 between the fourth gate electrode 420 and the fifth gate electrode 520.

For example, the distance S1 between the first gate electrode 120 and the second gate electrode 220 may be smaller than the distance S3 between the fourth gate electrode 420 and the fifth gate electrode 520.

Further, the thickness t1 of the lower interlayer insulating film 181 in the first region I may be equal to the thickness t2 of the lower interlayer insulating film 181 in the second region II.

In some embodiments, the ratio of the thickness of the upper interlayer insulating film 182 to the thickness t1 of the lower interlayer insulating film 181 in the first region I may be equal to the ratio of the thickness of the upper interlayer insulating film 182 to the thickness t2 of the lower interlayer insulating film 181 in the second region II.

In the embodiment disclosed hereinbelow, the lower interlayer insulating film 181 may have the tensile stress characteristic, and the upper interlayer insulating film 182 may have the compressive stress characteristic.

In some embodiments, because the distance S1 between the first gate electrode 120 and the second gate electrode 220 is smaller than the distance S3 between the fourth gate electrode 420 and the fifth gate electrode 520, the volume of the upper interlayer insulating film 182 having the compressive stress characteristic in the second region II may be greater than the volume of the upper interlayer insulating film 182 having the compressive stress characteristic in the first region I.

Thus, in some embodiments, when the first sidewall 120a of the first gate electrode 120 and the second sidewall 120c of the first gate electrode 120 have slopes at a right angle with respect to the bottom surface 120b of the first gate electrode 120, the first sidewall 420a of the fourth gate electrode 420 and the second sidewall 420c of the fourth gate electrode 420 may make an acute angle with respect to the bottom surface 420b of the fourth gate electrode 420.

In other embodiments, the lower interlayer insulating film 181 may have the compressive stress characteristic, and the upper interlayer insulating film 182 may have the tensile stress characteristic.

In such embodiments, unlike the embodiment described above, when the first sidewall 120a of the first gate electrode 120 and the second sidewall 120c of the first gate electrode 120 have slopes at a right angle with respect to the bottom surface 120b of the first gate electrode 120, the first sidewall 420a of the fourth gate electrode 420 and the second sidewall 420c of the fourth gate electrode 420 may make an obtuse angle with respect to the bottom surface 420b of the fourth gate electrode 420.

FIGS. 17, 18, and 19 illustrate gate profile control by adjusting the lower interlayer insulating film 181 and upper interlayer insulting film 182. For, example, the thickness of the upper interlayer insulting film 182 affects the profile of gate electrodes. In accordance with the thickness of the upper interlayer insulting film 182 formed on the lower interlayer insulating film 181 formed by removing of a portion of the pre lower interlayer insulating film in the manufacturing process, the slope of gate spacers may vary.

In case the compressive stress and the tensile stress is even, or close to even by adjusting the thickness of the upper interlayer insulting film 182 on the lower interlayer insulting film 181, the gate profile may be stiff. The width between gate sidewalls may remain the same as the distance from the substrate 100 increases.

Meanwhile, in case the compressive stress is greater than the tensile stress by adjusting the thickness of the upper interlayer insulting film 182, the gate profile may have a negative slope. The width between gate sidewalls may decrease as the distance from the substrate 100 increases.

In case the compressive stress is less than the tensile stress by adjusting the thickness of the upper interlayer insulting film 182, the gate profile may have a positive slope. The width between gate sidewalls may increase as the distance from the substrate 100 increases.

Figure 20:
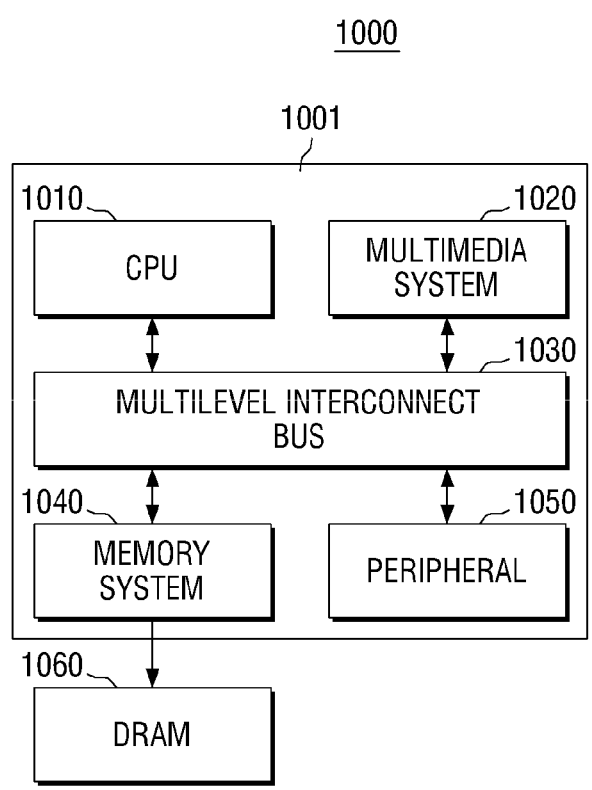
FIG. 20 is a block diagram of an SoC system comprising a semiconductor device, according to certain exemplary embodiments.

FIG. 20 is a block diagram of an SoC system comprising a semiconductor device according to exemplary embodiments.

Referring to FIG. 20, an SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operations for driving of the SoC system 1000. In some exemplary embodiments, the CPU 1010 may be configured on a multi-core environment which includes a plurality of cores.

The multimedia system 1020 may be used for performing a variety of multimedia functions on the SoC system 1000. The multimedia system 1020 may include a three-dimensional (3D) engine module, a video codec, a display system, a camera system, a post-processor, etc.

The bus 1030 may be used for exchanging data and other communications among one or more of the CPU 1010, the multimedia system 1020, the memory system 1040, and the peripheral circuit 1050. In some exemplary embodiments, the bus 1030 may have a multi-layer structure. Specifically, an example of the bus 1030 may be a multi-layer advanced high-performance bus (AHB), or a multi-layer advanced eXtensible interface (AXI), although exemplary embodiments are not limited herein.

The memory system 1040 may provide environments that allow for the application processor 1001 to connect to an external memory (e.g., DRAM 1060) and perform high-speed operation. In some exemplary embodiments, the memory system 1040 may include a separate controller (e.g., DRAM controller (not illustrated)) to control an external memory (e.g., DRAM 1060).

The peripheral circuit 1050 may provide environments that allow for the SoC system 1000 to have a seamless connection to an external device (e.g., main processing board, etc.). Accordingly, the peripheral circuit 1050 may include a variety of interfaces to allow compatible operation with the external device connected to the SoC system 1000.

The DRAM 1060 may function as an operation memory that allows for the operation of the application processor 1001. In some exemplary embodiments, the DRAM 1060 may be arranged externally to the application processor 1001, as illustrated. Specifically, the DRAM 1060 may be packaged into a package-on-package (PoP) type with the application processor 1001.

At least one of the above-mentioned components of the SoC system 1000 may include at least one of the semiconductor devices according to the exemplary embodiments explained above.

In concluding the detailed description, those skilled in the art will appreciate that many variations and modifications can be made to the disclosed embodiments without substantially departing from the principles of the present disclosure. Therefore, the disclosed embodiments are used in a generic and descriptive sense only and not for purposes of limitation.

What is claimed is:

1. A semiconductor device, comprising:
a substrate including a first region and a second region;
a first gate electrode formed in the first region and on the substrate;
a second gate electrode formed in the second region and on the substrate;
a first gate spacer formed on a sidewall of the first gate electrode and including an upper portion and a lower portion;
a second gate spacer formed on a sidewall of the second gate electrode and including an upper portion and a lower portion;
a lower interlayer insulating film formed on the substrate and adjacent to the lower portion of the first gate spacer and the lower portion of the second gate spacer; and
an upper interlayer insulating film formed on the lower interlayer insulating film and adjacent to the upper portion of the first gate spacer and the upper portion of the second gate spacer, an upper surface of the upper interlayer insulating film being on a same plane as an upper surface of the first gate electrode and an upper surface of the second gate electrode, wherein a slope of the sidewall of the first gate electrode relative to a bottom surface of the first gate electrode is different from a slope of the sidewall of the second gate electrode relative to a bottom surface of the second gate electrode, wherein, with respect to a vertical cross section, the slope of the sidewall of the second gate electrode is either positive along its entire vertical length or negative along its entire vertical length, and wherein the lower interlayer insulating film has one of a tensile stress characteristic or a compressive stress characteristic with respect to the lower portion of the first gate spacer and the lower portion of the second gate spacer, and the upper interlayer insulating film has the other of the tensile stress characteristic or the compressive stress characteristic with respect to the upper portion of the first gate spacer and the upper portion of the second gate spacer.

2. The semiconductor device of claim 1,
wherein a width of the first gate electrode remains substantially constant as a distance from an upper surface of the substrate increases, and
wherein a width of the second gate electrode increases as the distance from the upper surface of the substrate increases.

3. The semiconductor device of claim 1,
wherein a width of the first gate electrode remains substantially constant as a distance from an upper surface of the substrate increases, and
wherein a width of the second gate electrode decreases as the distance from the upper surface of the substrate increases.

4. The semiconductor device of claim 1, further comprising:
a third gate electrode formed on the substrate in the first region and being adjacent to the first gate electrode; and
a fourth gate electrode formed on the substrate in the second region and being adjacent to the second gate electrode,
wherein, with reference to a bottom surface of the first gate electrode and a bottom surface of the third gate electrode, a spacing between the first gate electrode and the third gate electrode is different from a spacing between the second gate electrode and the fourth gate electrode relative to the bottom surface of the second gate electrode and the bottom surface of the fourth gate electrode.

5. The semiconductor device of claim 1, wherein a thickness of the lower interlayer insulating film in the first region is different from a thickness of the lower interlayer insulating film in the second region.

6. The semiconductor device of claim 1, further comprising: a first fin-type pattern and a second fin-type pattern protruding from the substrate, wherein the first gate electrode intersects with the first fin-type pattern, and the second gate electrode intersects with the second fin-type pattern.

7. A semiconductor device, comprising:
a substrate including a first region and a second region;
a first gate electrode formed in the first region and on the substrate;
a second gate electrode formed in the second region and on the substrate;
a first gate spacer formed on a sidewall of the first gate electrode and including an upper portion and a lower portion;
a second gate spacer formed on a sidewall of the second gate electrode and including an upper portion and a lower portion;
a lower interlayer insulating film formed on the substrate in the first and second regions, the lower interlayer insulating film directly adjacent to the lower portion of the first gate spacer and directly adjacent to the lower portion of the second gate spacer; and
an upper interlayer insulating film formed on the lower interlayer insulating film in the first and second regions, the upper interlayer insulating film directly adjacent to the upper portion of the first gate spacer and directly adjacent to the upper portion of the second gate spacer,
wherein the lower interlayer insulating film is not interposed between the upper interlayer insulating film and the upper portion of the first gate spacer, and is not interposed between the upper interlayer insulating film and the upper portion of the second gate spacer, and
wherein a ratio of a thickness of the upper interlayer insulating film to a thickness of the lower interlayer insulating film in the first region is smaller than a ratio of a thickness of the upper interlayer insulating film to a thickness of the lower interlayer insulating film in the second region.

8. The semiconductor device of claim 7, wherein a stress characteristic of the upper interlayer insulating film is different from the stress characteristic of the lower interlayer insulating film.

9. The semiconductor device of claim 7, wherein a slope of the sidewall of the first gate electrode relative to a bottom surface of the first gate electrode is different from a slope of the sidewall of the second gate electrode relative to a bottom surface of the second gate electrode.

* * * * *